United States Patent
Hudson

(10) Patent No.: US 10,134,933 B2
(45) Date of Patent: Nov. 20, 2018

(54) SYSTEM FOR ISOLATING PORTIONS OF A POWER SUPPLY ARRAY

(71) Applicant: Donald Joseph Hudson, New South Wales (AU)

(72) Inventor: Donald Joseph Hudson, New South Wales (AU)

(73) Assignee: D B BONES PTY. LTD., New South Wales (AU)

( * ) Notice: Subject to any disclaimer, the term of this patent is extended or adjusted under 35 U.S.C. 154(b) by 1054 days.

(21) Appl. No.: 13/899,722

(22) Filed: May 22, 2013

(65) Prior Publication Data
US 2014/0345667 A1 Nov. 27, 2014
US 2018/0294645 A9 Oct. 11, 2018

Related U.S. Application Data

(63) Continuation of application No. PCT/AU2011/001502, filed on Nov. 22, 2011.

(30) Foreign Application Priority Data

Nov. 22, 2010 (AU) ................................ 2010905177
Jan. 25, 2011 (AU) ................................ 2011900225

(51) Int. Cl.
*H01L 31/05* (2014.01)
*H01L 31/02* (2006.01)
*H02S 40/36* (2014.01)

(52) U.S. Cl.
CPC ........ *H01L 31/05* (2013.01); *H01L 31/02021* (2013.01); *H02S 40/36* (2014.12); *Y02E 10/50* (2013.01)

(58) Field of Classification Search
CPC ................................ H01L 31/05; H02S 40/36
See application file for complete search history.

(56) References Cited

U.S. PATENT DOCUMENTS 6,515,215 B1 * 2/2003 Mimura ................. H02S 50/10
  136/244
2014/0169053 A1 * 6/2014 Ilic .................... H02M 7/53873
  363/132

OTHER PUBLICATIONS

Amos, S.W., Newnes Dictionary of Electronics, Reed Educational and Professional Publishing, 1999, edtion 4, p. 289.*

* cited by examiner

*Primary Examiner* — Daniel Cavallari
(74) *Attorney, Agent, or Firm* — Young & Thompson

(57) ABSTRACT

A system for isolating portions of a power supply array comprising at least one isolation mechanism being in electrical communication with a terminal of at least one portion of the power supply array, the isolation mechanism being arranged to disconnect the at least one portion from the power supply array when the isolation mechanism is actuated.

16 Claims, 19 Drawing Sheets

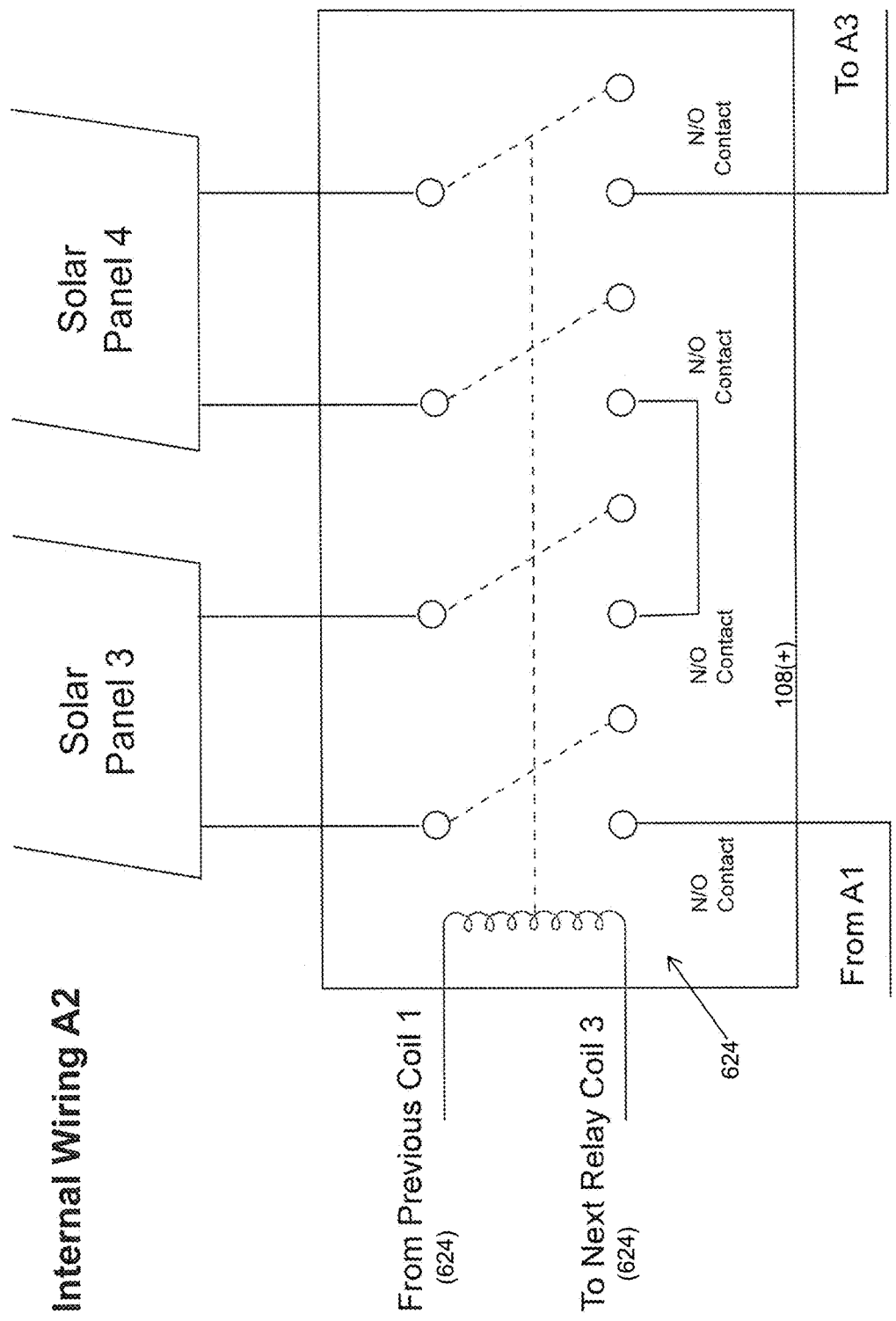

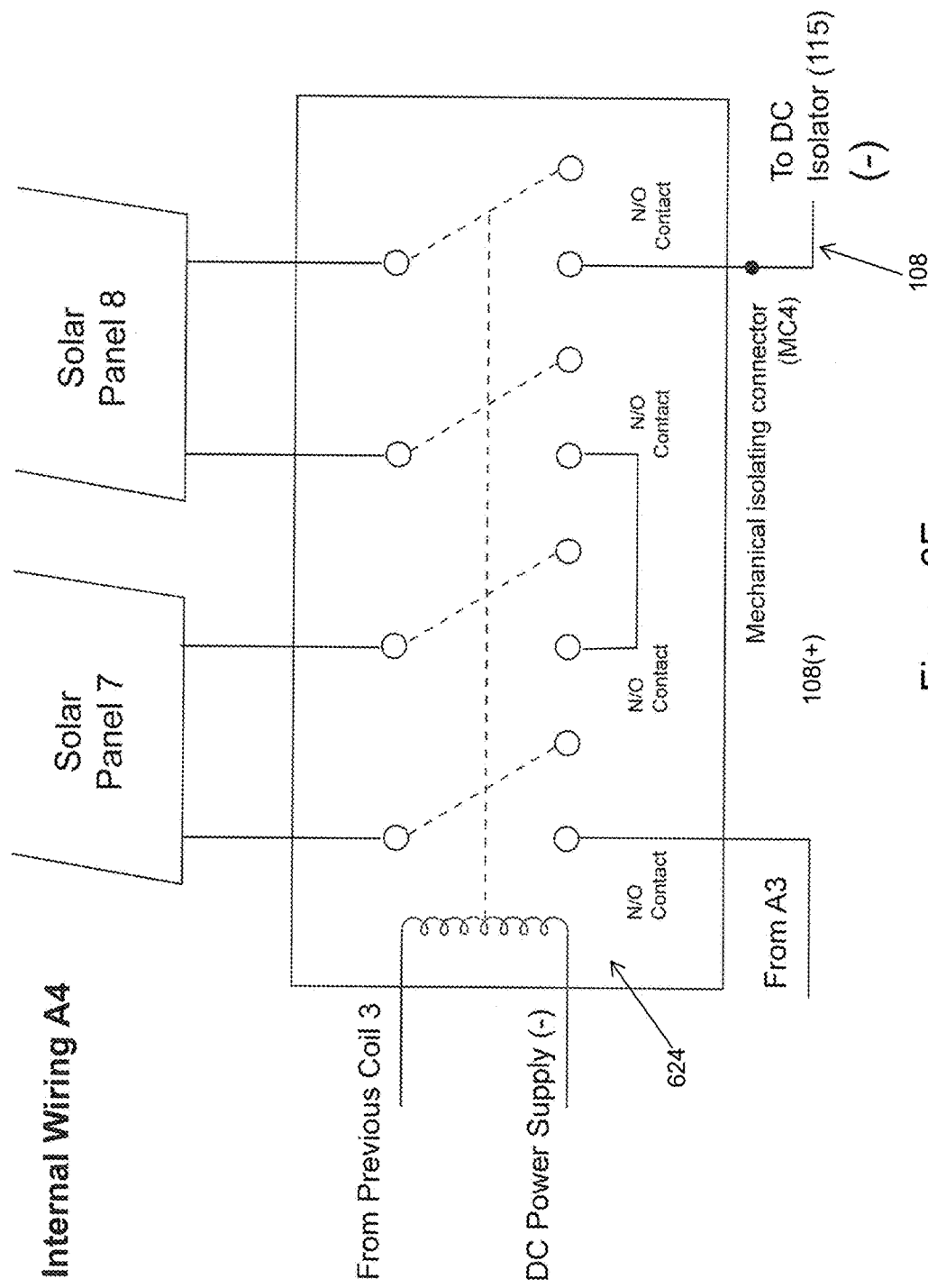

SYSTEM FOR ISOLATING PORTIONS OF A POWER SUPPLY ARRAY

CROSS REFERENCE TO RELATED APPLICATIONS

This utility patent application filed under 35 USC § 111 is a continuation of international patent application PCT/AU2011/001502 filed on Nov. 22, 2011, and claims priority to Australian patent application 2010905177 filed on Nov. 22, 2010 and Australian patent application 2011900225 filed on Jan. 25, 2011, which are all incorporated by reference herein.

TECHNICAL FIELD

This invention relations to a system for isolating portions of a power supply array, and particularly, although not exclusively, to a system for isolating portions of a photovoltaic array.

BACKGROUND

As renewable energy becomes a mainstream form of supplying electricity, home and business owners are installing photovoltaic cells (colloquially known as "solar panels") to generate electric power for their energy needs. Solar panels are generally installed in the form of a solar panel array which comprises an array of individual solar panels attached to a roof or wall of a building. Although each individual solar panel in the array may not create a large amount of useful energy, the plurality of panels in an array can supply a sizeable quantity of energy to supply power to the building or be fed back to a wider electrical grid.

Solar panels continue to generate an electric current as long as they are exposed to light. As a result, an array of panels on the roof of a building can generate a large amount of energy during daylight hours. However, unlike conventional "grid" power which can be disconnected from the building during an emergency, the electric current supplied by the solar panel cannot be disconnected from the building since electric current is generated continuously while the solar array continues to be exposed to sunlight. In these circumstances, a hazardous situation may occur during an emergency situation as the solar panels will continue to be "live" even when they have been disconnected from the grid.

SUMMARY OF THE INVENTION

In accordance with a first aspect of the present invention, there is provided a system for isolating portions of a power supply array comprising:

at least one isolation mechanism being in electrical communication with an output terminal of at least one portion of the power supply array;

the isolation mechanism being arranged to disconnect the at least one portion from the power supply array when the isolation mechanism is actuated.

In an embodiment of the first aspect, the at least one portion of the power supply array is a power supply unit arranged to supply electrical power independently of other portions of the power supply array.

In an embodiment of the first aspect, the power supply array incorporates at least one solar panel.

In an embodiment of the first aspect, the power supply unit includes a solar panel.

In an embodiment of the first aspect, the at least one isolation mechanism is an electric actuator.

In an embodiment of the first aspect, the at least one switch mechanism is arranged to operate to disconnect the at least one portion of the power supply array from the power supply array when electrical power is disconnected from the electric actuator.

In an embodiment of the first aspect, the electrical power connected to the electric actuator is powered by at least the power supply array.

In an embodiment of the first aspect, the power supply array is arranged to connect to an electrical grid.

In an embodiment, the at least one portion of the power supply array is a power supply unit arranged to supply electrical power independently of other portions of the power supply array.

In an embodiment, the terminal includes an output terminal.

In an embodiment, the power supply array is a solar panel array.

In an embodiment, the isolation mechanism is arranged to disconnect the portion of the power supply array from the power supply array by disconnecting the terminal of the portion from a conduit in electrical communication with the power supply array.

In an embodiment, the conduit is arranged to combine electricity supplied by each portion of the power supply array.

In an embodiment, the conduit is arranged to transmit electricity supplied by the power supply array.

In an embodiment, the power supply array transmits electrical power to the power source.

In an embodiment, the electrical power is disconnected from the electric actuator by at least one switch.

In an embodiment, the at least one switch is connected in series between the electric actuator and the power source.

In an embodiment, the at least one switch is arranged to be actuated at a predetermined temperature.

In an embodiment, the switch is a thermal fuse.

In an embodiment, the at least one isolation mechanism is located in a housing.

In an embodiment, the system further includes a switch arranged to disconnect the at least one isolation mechanism from the power source when the housing is manipulated.

In an embodiment, the switch is connected in series between the at least one isolation mechanism and the power source.

In accordance with a second aspect of the present invention, there is provided a control system for controlling a system for isolating portions of a power supply array comprising:

a device for arranged to control the isolation mechanism in accordance with any one of the embodiments of the first aspect;

wherein the device is arranged to be activated to actuate the isolation mechanism.

In an embodiment of the second aspect, the device is connected to a communications network to receive activation commands.

In an embodiment of the second aspect, the device is arranged to be activated remotely from the isolation mechanism.

In accordance with a third aspect of the present invention, there is provided a method for isolating portions of a power supply array comprising the steps of actuating the isolation mechanism in accordance with any embodiment of the first aspect.

In accordance with a fourth aspect of the present invention, there is provided an electrical system comprising a power supply array and the system for isolating the power supply array in accordance with any one of the embodiments of the first aspect.

In accordance with a fifth aspect of the present invention, there is provided a solar panel comprising the isolation mechanism in accordance with any one of the embodiments of the first aspect.

In accordance with a sixth aspect of the present invention, there is provided a solar panel array comprising the system for isolating portions of a power supply array in accordance with any one of the embodiments of the first aspect.

BRIEF DESCRIPTION OF THE DRAWINGS

Embodiments of the present invention will now be described, by way of example, with reference to the accompanying drawings in which:

FIGS. 6A to 6E are wiring diagrams of a system for isolating a power supply array in accordance with another embodiment of the invention;

DETAILED DESCRIPTION OF THE PREFERRED EMBODIMENT

Figure 1:
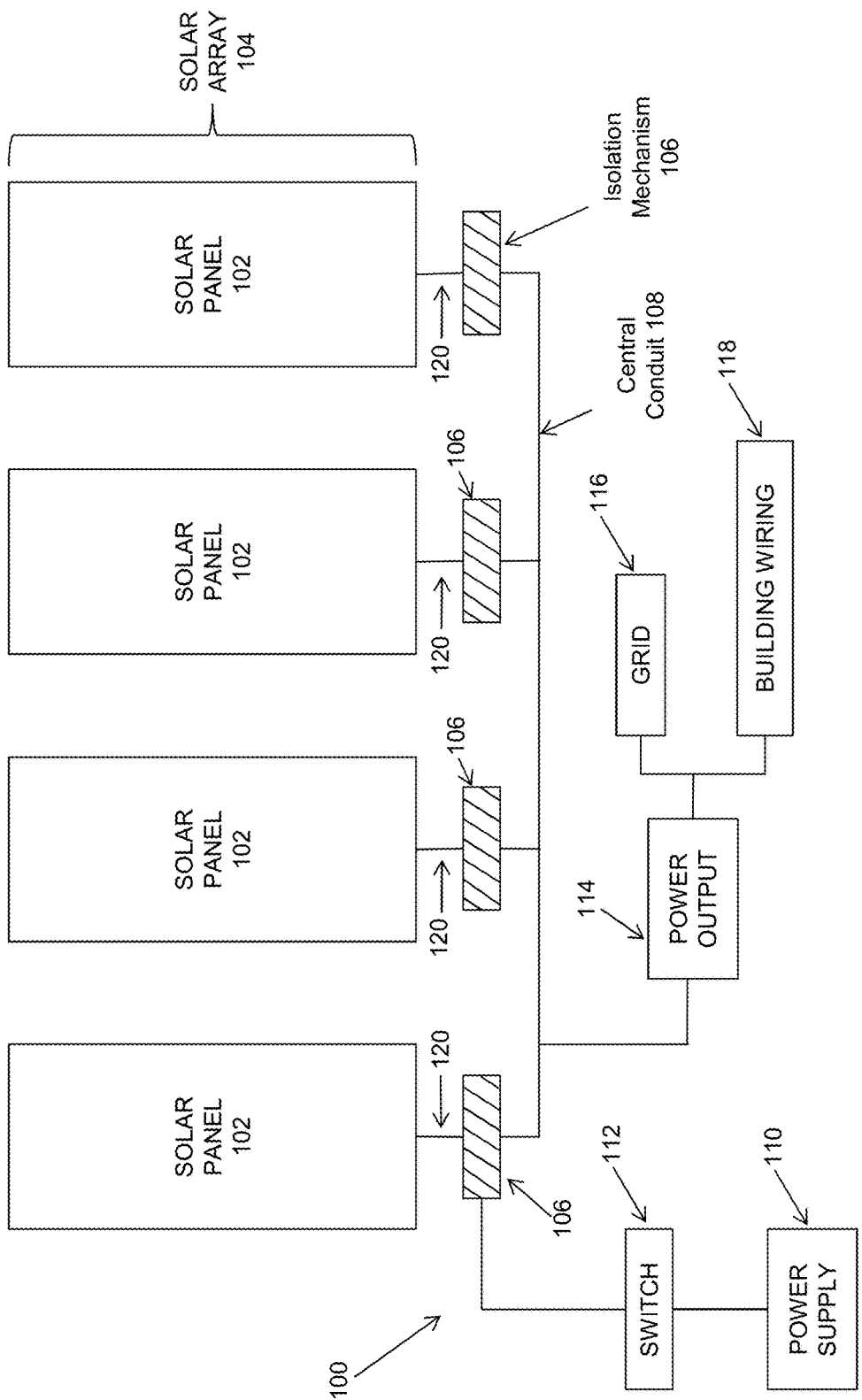
FIG. 1 is a block diagram illustrating the system for isolating a power supply array in accordance with one embodiment of the present invention.

Referring to FIG. 1, there is illustrated an embodiment of a system for isolating portions of a power supply array comprising at least one isolation mechanism being in electrical communication with an output terminal of at least one portion of the power supply array, the isolation mechanism being arranged to disconnect the at least one portion from the power supply array when the isolation mechanism is actuated.

In this embodiment, a power supply array 104 comprises a plurality of power supply portions 102 that are arranged to supply electric current to a power output 114 which in turn transmits electric power to wiring 118 or to the main electrical transmission grid 116. In one example, the power supply array may be a solar panel array 104, with each solar panel 102 defining a single power supply portion of the array. In this example, each solar panel 102 may be arranged to generate a defined voltage (and associated current) independently of other panels in the solar panel array 104. These solar panels 102 may be wired together, either in series or parallel to produce a combined amount of electric power. This combined amount of electric power may be transmitted to a central electrical conduit which is arranged to connect to each of the solar panels 102 either in parallel, series or a combination of both to transmit the combined electrical power of the entire solar panel array 104 to the power output 114. The electrical conduit may include an electric wire, cable or any form of conductive medium capable of transmitting electricity. Preferably, the electrical conduit transmits the combined electrical power of the entire solar panel array 104 to a switchboard which acts as the interface between an external electricity grid and the wiring circuit of the building.

As illustrated in FIG. 1, an isolation mechanism 106 may be installed between each of the solar panels 102 and the central conduit 108. In one embodiment, the isolation mechanism 106 is connected to the power output terminal 120 of each of the solar panels 102 and the central conduit 108. Preferably, each solar panel 102 within the solar panel array 104 will be connected to each individual isolation mechanism 106, although it is possible, in alternative embodiments, that an isolation mechanism 106 is connected to more than one solar panel 102 within the array 104, and thus services more than one solar panel 102.

In the embodiment illustrated in FIG. 1, the isolation mechanism 106 is arranged to route the electrical power generated by each solar panel 102 within the array to either the central conduit 108 or to a separate circuit away from the central conduit 108. The separate circuit may redirect the electrical power generated by each solar panel to an alerting L.E.D, a resistor, to a ground or by simply leaving the solar panel circuit open. The mechanism 106 may be actuated by an actuator or switch 112 to change direction of the electricity flowing from each solar panel 102. Embodiments of the isolation mechanism 106 are further described with reference to FIGS. 2, 3A, 3B and 5A to 5F.

In some embodiments, the isolation mechanism 106 is arranged to isolate each portion of the array 104 such that each portion of the array 104 may be isolated from the central conduit 108, as required by a user. Once the isolation mechanism 106 isolates each portion of the array 104 from the central conduit 108, the combined electrical power in the central conduit 108 is reduced. In this way, the electric power which may be generated by each portion of the array is isolated rather than combined into a single source. As a result, this arrangement may substantially reduce the risk of electrocution, fires or electric shocks which may otherwise be present in the central conduit 108 from the combined electrical power generated by the entire solar panel array 104.

These embodiments are advantageous in that a power supply array 104 may be isolated into individual portions generating a lower amount of power. This may at least reduce the risk of electrical hazards such as electrocutions, injuries or fires should the electrical power be transmitted inadvertently to people, buildings or combustible sources. In some embodiments, the power supply array 104 may also be completely isolated from the grid or wiring circuit of the building and thus electrical power generated by the solar panel array 104 may be cut off from the rest of the building wiring or grid when it is necessary.

Figure 2:
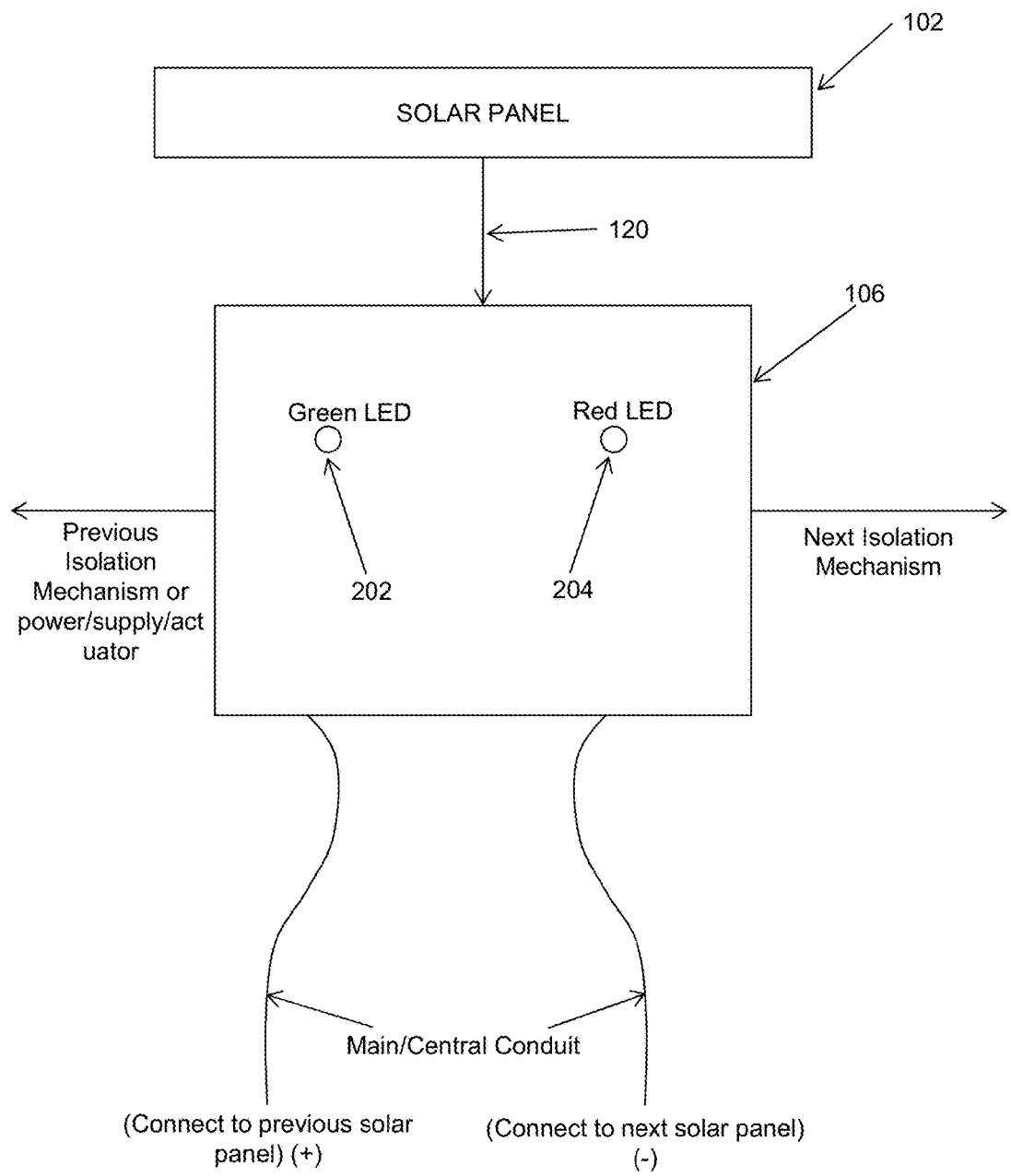
FIG. 2 is a block diagram illustrating an embodiment of an isolation mechanism of the system in FIG. 1.
Figure 3A:
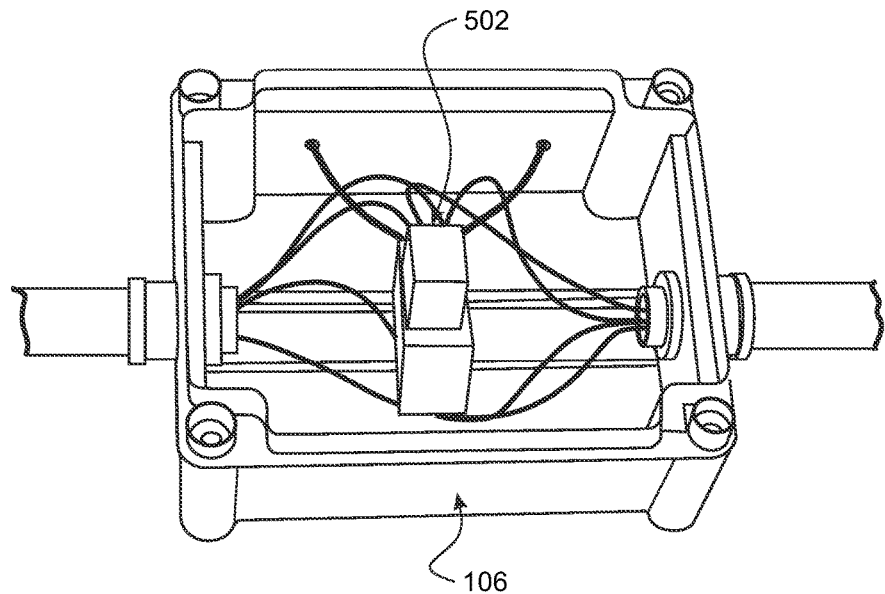
FIG. 3A is a photograph illustrating the components of an embodiment of the isolation mechanism of FIG. 2.
Figure 3B:
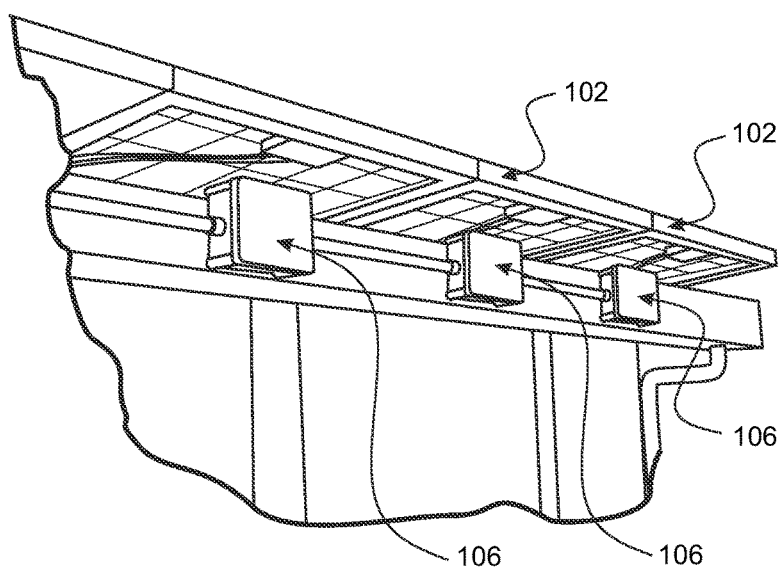
FIG. 3B is a photograph illustrating an example trial installation of the isolation mechanism of FIG. 2 on a solar panel array.
Figure 4:
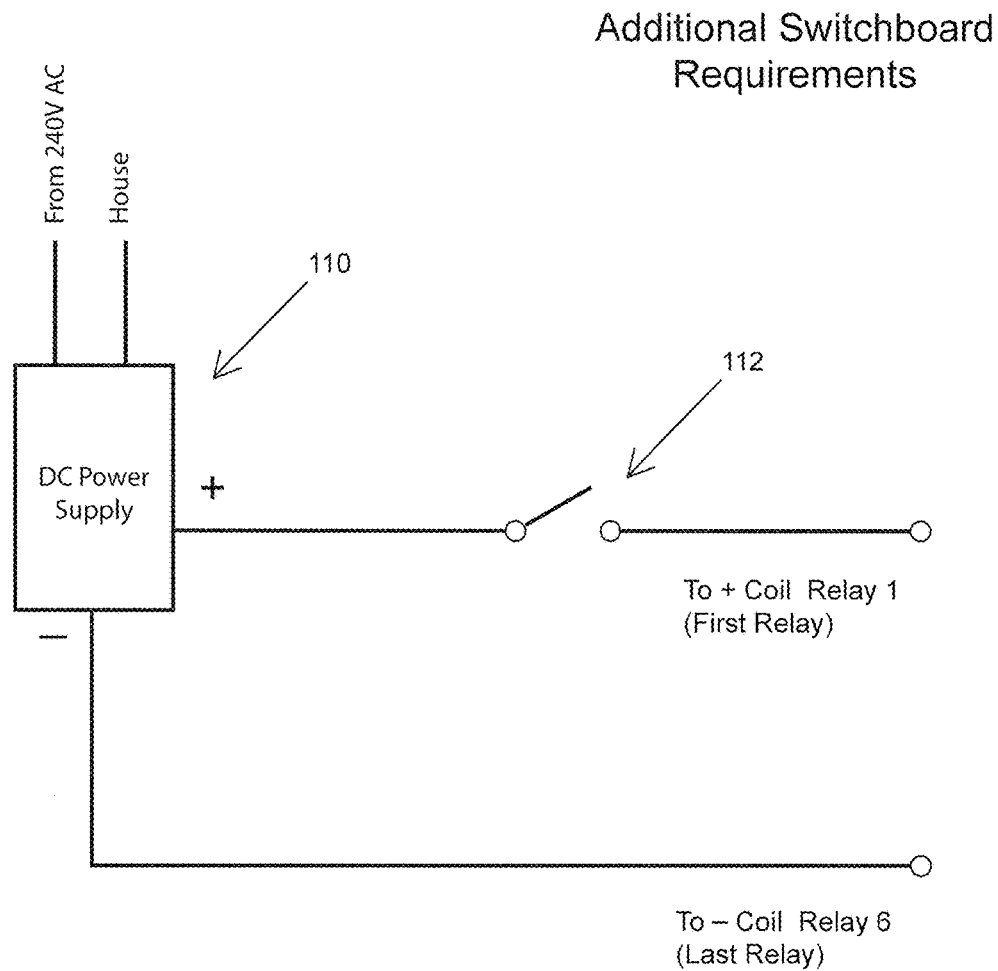
FIG. 4 is an embodiment of a switchboard wiring diagram of the system of FIG. 1.
Figure 5A:
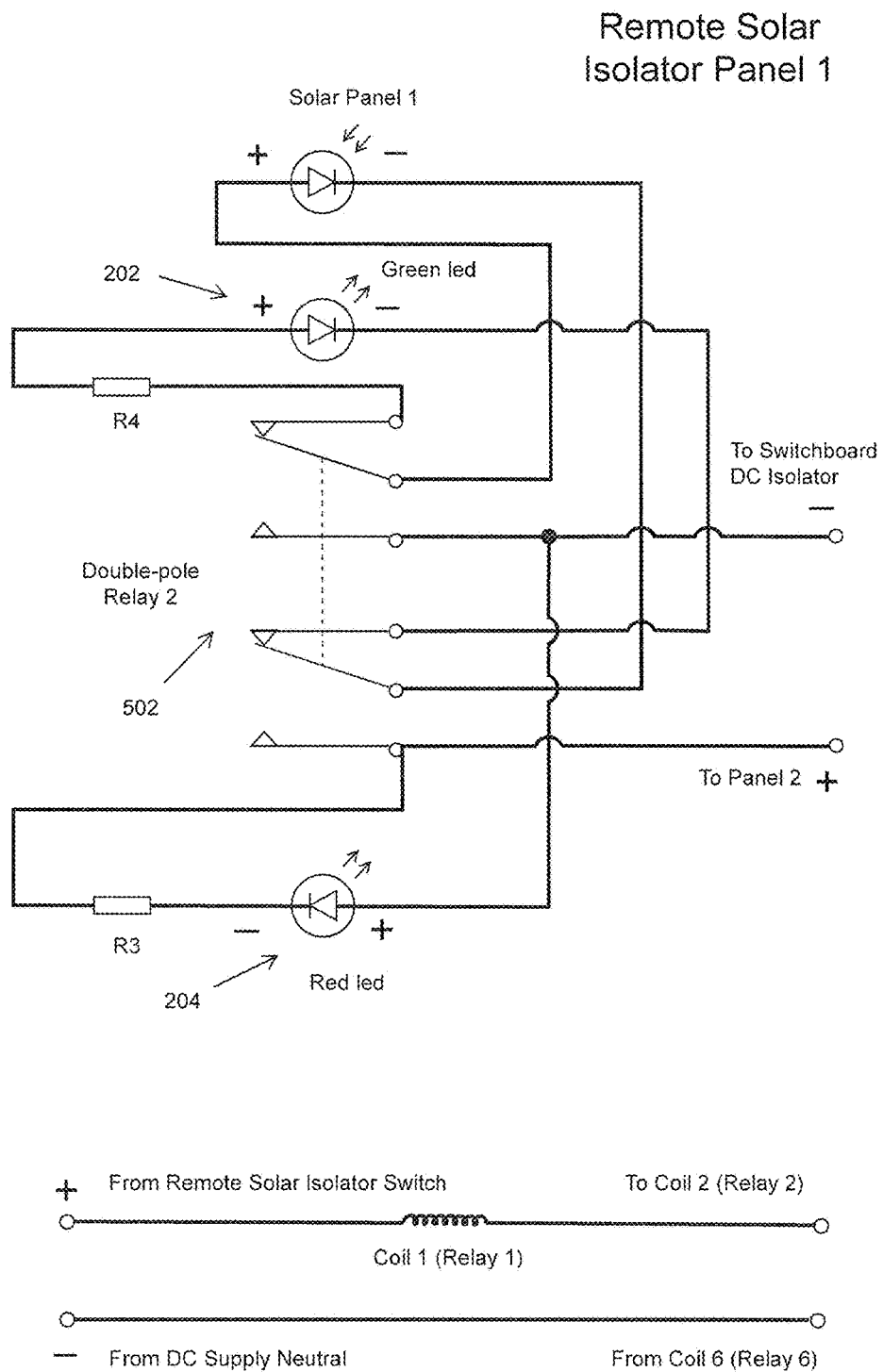
FIGS. 5A to 5F are wiring diagrams illustrating an example installation of one embodiment of the isolating mechanism to a solar panel array comprising six individual solar panels.
Figure 5B:
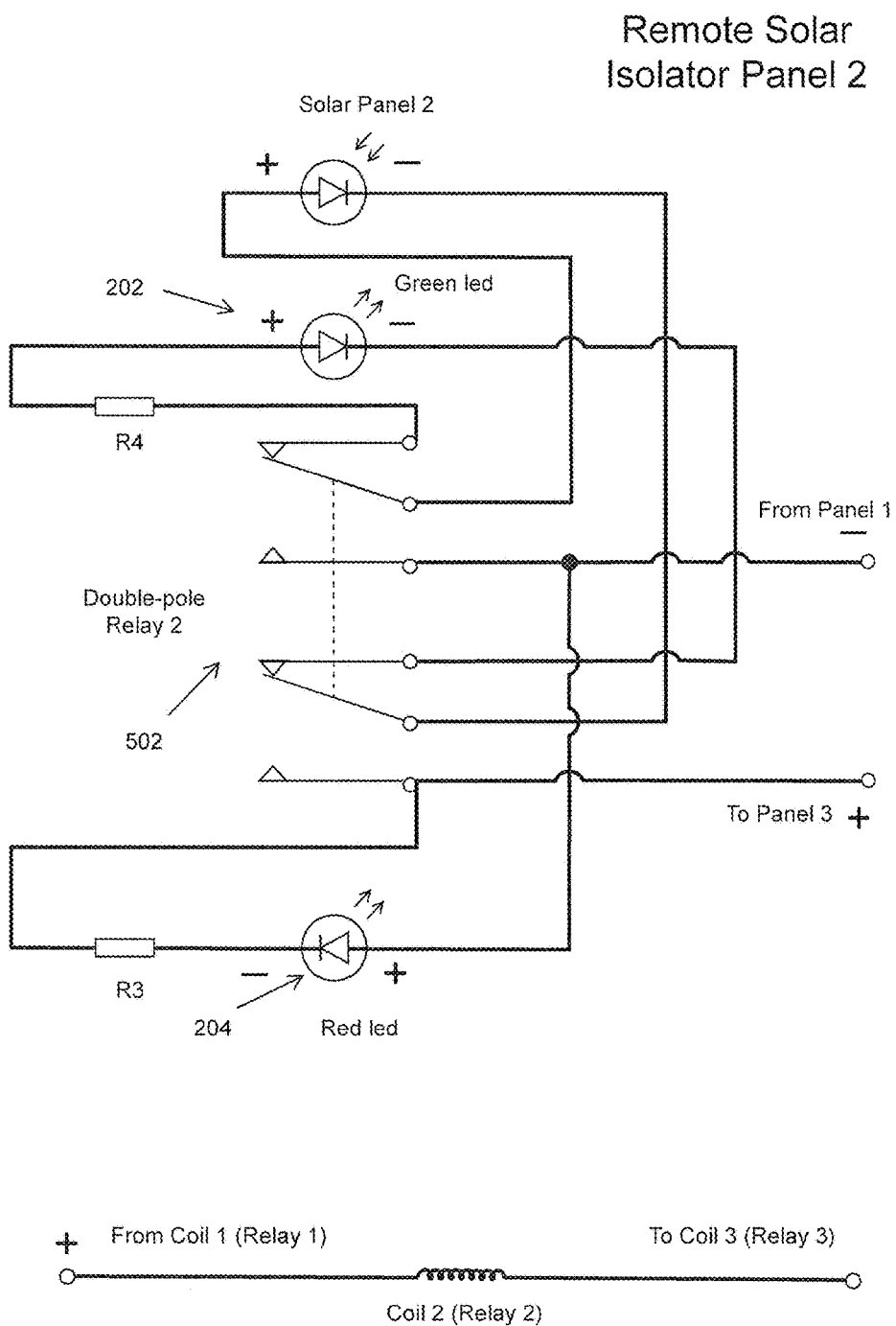
Figure 5C:
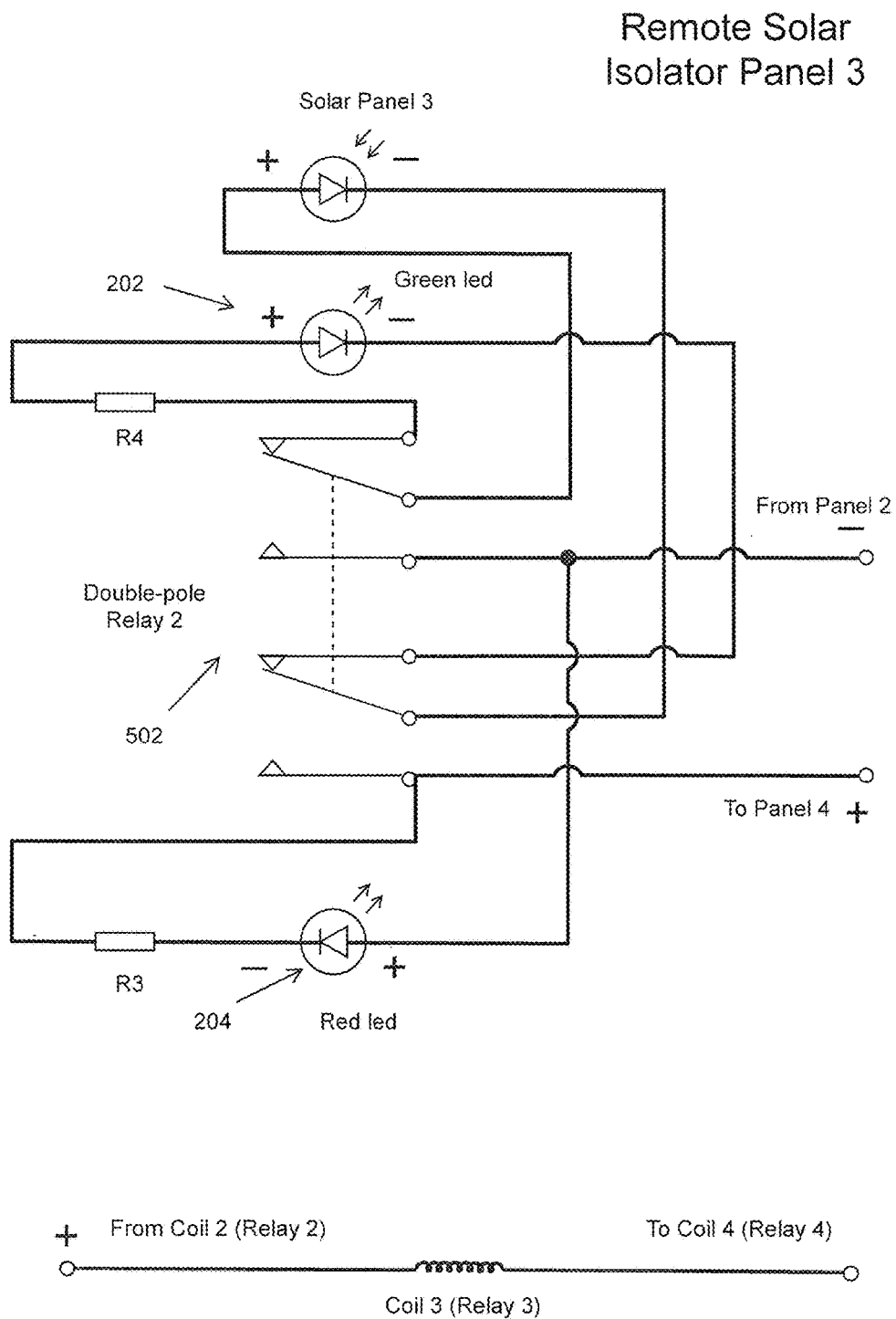
Figure 5D:
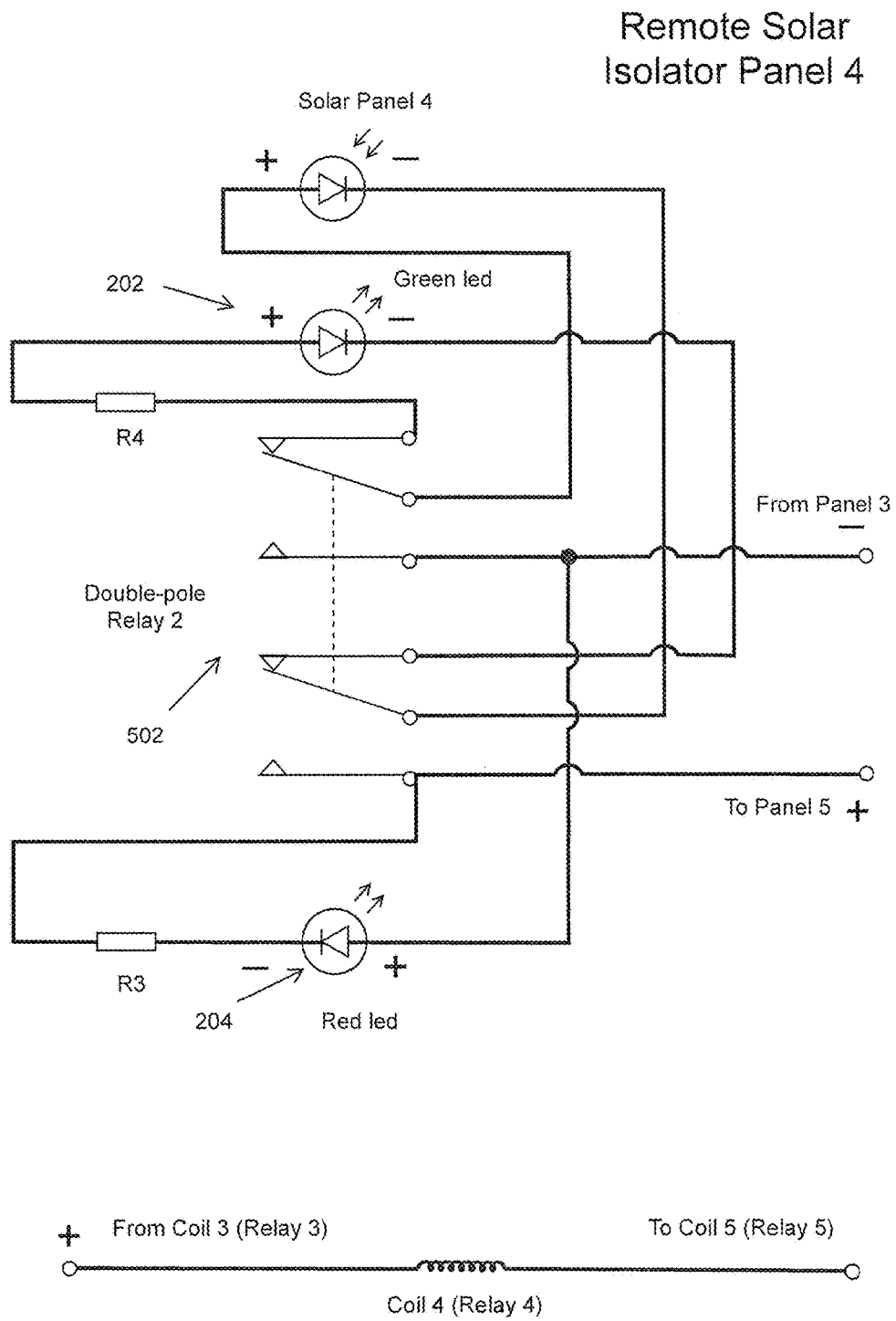
Figure 5E:
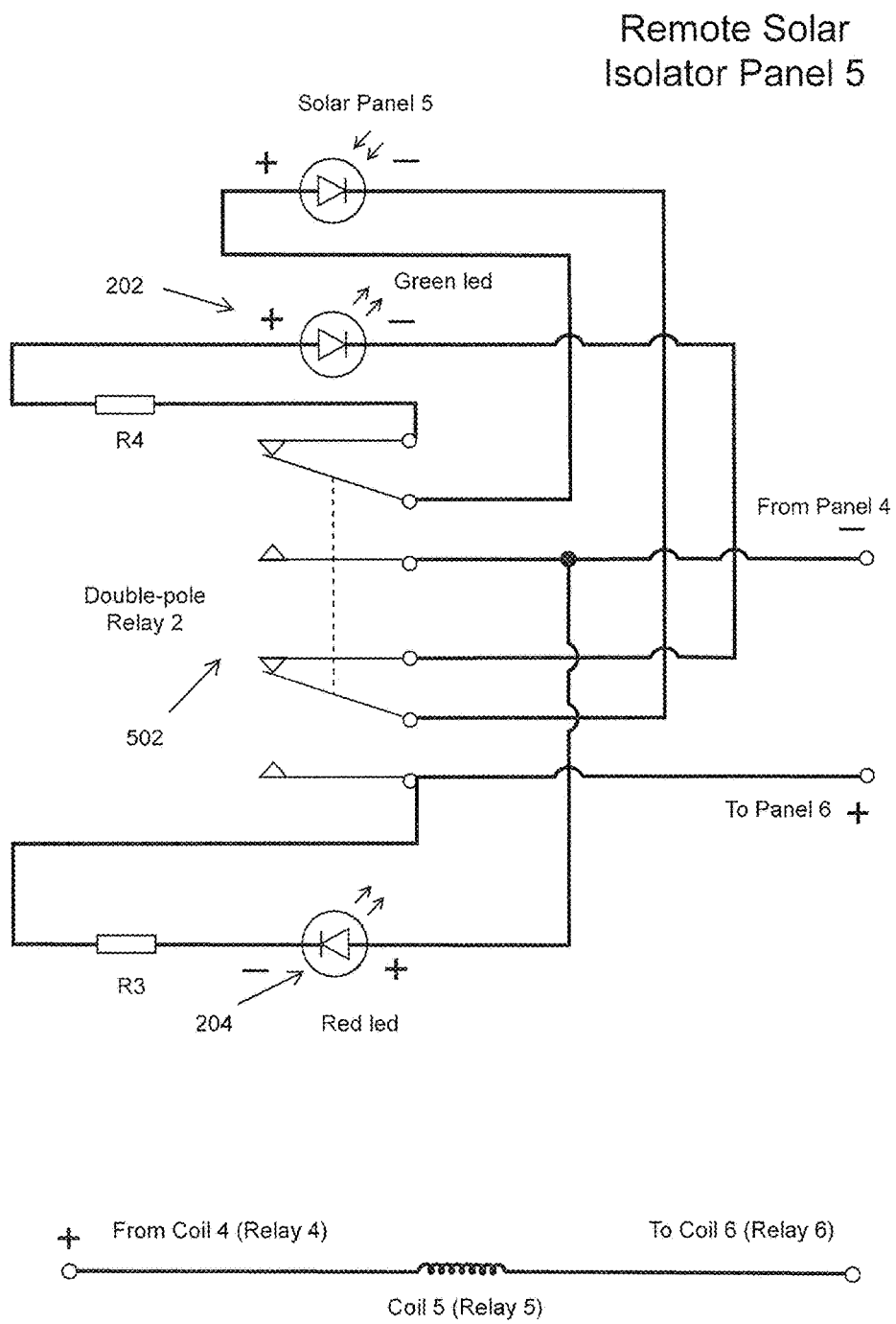
Figure 5F:
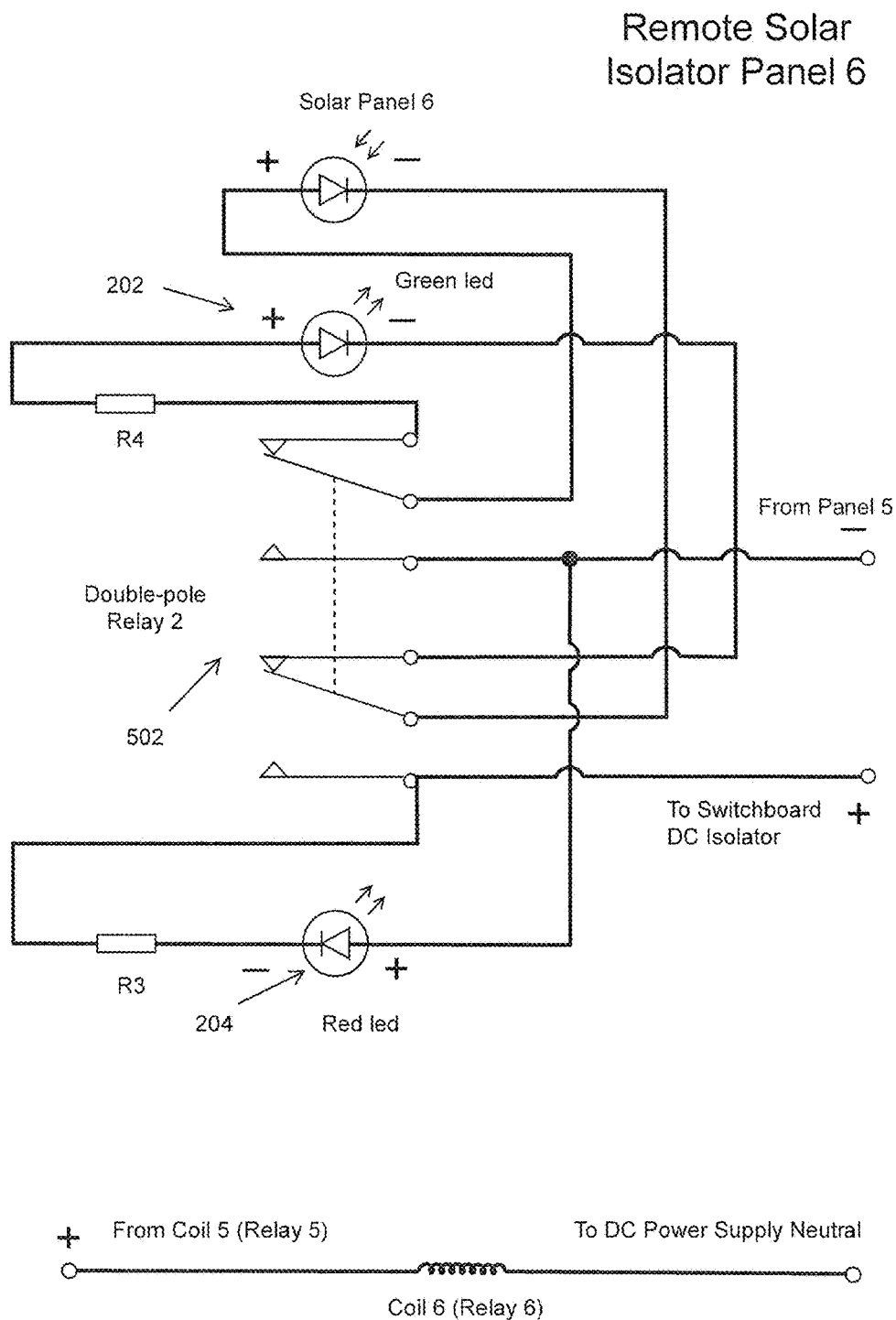

With reference to FIGS. 2, 3A and 3B, there is illustrated an embodiment of an isolation mechanism 106. In this embodiment, the isolation mechanism 106 is arranged to connect to a portion of a power supply array, such as a solar panel array 104 such that when the user wishes to isolate the solar panel array 104 into individual portions, the isolation mechanism 106 is able to disconnect the portion from the reminder of the array 104.

In this example, the isolation mechanism 106 comprises an electrical switch, which when actuated, allows the electrical power generated by the connected portion of the array 104 to be transmitted to the central conduit 108 for transmission to the power output 114 as a combined source of electrical power. Once the electrical switch is actuated in the opposite direction, the circuit is broken between the central conduit 108 to each of the solar panel 102, and as a result, the electrical power generated by the portion of the array 104 is redirected away from the central conduit 108. Preferably, the electrical power is then routed to a separate circuit, such as a circuit with an alert L.E.D, open circuit or earth to thereby safely deactivating the portion of the array from being combined with electricity generated by other portions of the array to generate any combined electrical current which may cause an electrical hazard.

In one embodiment, the isolation mechanism 106 includes a relay switch 502 which is arranged to connect a portion of the array to the central conduit 108 when electrical power is delivered to the relay switch 502. Once electrical power is disconnected from the relay switch 502, the switch 502 is arranged to open the circuit between the portion of the array 104 and the central conduit 108, and thereby disconnect the serviced portion of the array 104 from the central conduit 108. Preferably, once electrical power is disconnected from the relay switch to open the circuit between the portion of the array 104 and the central conduit 108, the electrical power generated by the circuit is directed to earth or ground.

In other embodiments, the isolation mechanism 106 may include other forms of switches, actuators, servos or any other mechanical or electrical device which can provide a function of allowing the electricity generated by the portions of the array 104 to be transmitted to the central conduit 108 or rerouted away from the central conduit 108.

These embodiments of the isolation mechanism 106 are advantageous in that once electrical power is disconnected from the relay switch 502, portions of the power supply array is isolated. In a setting with regards to a solar panel array 104, should a building having an array 104 be subject to any emergency situation (e.g. fire) the power to the isolation mechanism 106 may be disconnected through a switch 112 at the switchboard. Once power is disconnected to the relay switch 502, the natural non-powered position of the relay 502 will open the circuit between each of the solar panels 102 in the array 104 and the central conduit 108 whilst directing the generated electrical power of each panel to earth, ground, an alternative circuit or to an open circuit, thus leaving a central conduit 108 of the solar panels 102 to carry very little or no electrical current. As the amount of uncontained electrical current is only at the maximum generated amount of each solar panel 102, emergency action, such as the spraying of water onto the solar panels or access by emergency personnel, may be continued without risk of injuries, electrocution or other forms of electrical hazards.

In addition, some embodiments of the system for isolating portions of a power supply array may also isolate the entire array from the electricity grid or building wiring. These embodiments are advantageous in that by disconnecting portions of the power supply array, the loading of each of the switches or actuators does not need to be excessively high. In large solar panel arrays for example, such as those found on top of large shopping malls, a switch arranged to disconnect the entire solar panel array may have to be designed to handle a large loading due to the large number of solar panels in the array. By disconnecting portions of the array, the problem of designing an actuator which can handle the load of the entire array is removed.

In alternative embodiments, the actuators or switches may include electrical circuits or mechanical devices which allow the actuators or switches to be remotely controlled. In these embodiments, an electronic interface may be installed to actuate the switch such that the power supply array or portions thereof may be disabled remotely or as part of an alert system. In some examples, these electrical circuits or mechanical devices may be connected to a computer system, computer network for remote disconnection by authorized parties, or alternatively the electrical circuits or mechanical devices may also be connected to a thermostat, fuse or monitoring device which activate when a dangerous situation is detected.

With reference to FIGS. 4 and 5A to 5F, there is shown a wiring diagram illustrating an example embodiment in installing the system for isolating a power supply array on a solar panel array with six individual solar panels. In this embodiment, the solar panel array is connected to the switchboard which reroutes the electrical current generated by the solar panel array to the building wiring and to the electrical grid.

In this embodiment, a power supply 110 is connected to each of the isolation mechanisms 106 in series. This power supply 110 includes a switch 112 arranged to be actuated when a user desires to isolate each of the solar panels within the array. The switch 112 may include, without limitation, a single or double pole switch. The power supply may be a DC power supply powered by any source such as the electricity grid, or by the solar panel array. In this example, as there are six individual solar panels, a total of 36 volts is supplied by the DC power supply to power the six, 6 volt relays 502 which are connected in series. In embodiments where there are more than six isolation mechanisms 106, or the voltage requirements of each relay 502 varies, the total voltage to be supplied by the DC power supply is the equivalent to the number of relays multiplied by the voltage requirement of each relay if the relays are wired in series.

In alternative embodiments, the system may include a thermal circuit breaker arranged to disconnect the power supply 110 from the isolation mechanisms 106 when the pre-determined temperature is recorded. In these embodiments, the thermal circuit breaker may be wired in series with the isolation mechanisms 106 with the switch 112 such that once the breaker is activated, electrical power from the power supply 110 is disconnected from the isolation mechanisms 106 and thus have the effect of actuating the isolation mechanisms 106 to isolate each of the solar panels within the array.

In one example, the thermal circuit breaker may be a thermal fuse arranged to burn out or melt away to break the circuit once a predetermined temperature is reached. In another example, the thermal circuit breaker may be an electronically controlled or mechanical switch having a thermostat or temperature sensor which is arranged to break the circuit when the switch is at a predetermined temperature. These embodiments are advantageous in that in the event of excessive high temperatures, such as a fire or extreme environmental conditions, the solar array can be automatically isolated to reduce the risk of electrical hazards or the chances of damaging the solar array.

In another embodiment, the system may also include one or more micro switches arranged to disconnect the power supply 110 from the isolation mechanisms 106. These micro switches may be connected to portions of the system to detect user manipulation of the system. Once user manipulation of the system is detected, the micro switch disconnects the power supply 110 from the isolation mechanism 106, and thereby isolates the solar array.

In these embodiments, the micro switches may be connected in series with the power supply 110 and actuated when manipulation is detected, such as the opening of an access panel of the isolation mechanism 106 and/or the main electrical switch board of the property which has the solar array installed. These embodiments are advantageous in that portions of the solar array may be isolated when the system is manipulated by a user for maintenance or repairs and thereby reduce the risk of electrical hazards for servicemen.

In some embodiments, a volt meter may be connected to the central conduit 108 to measure to combine voltage generated by the power supply array. This volt meter is particularly useful as it can indicate in real time the voltage of the enter power supply array and thereby alerting a user as to the power transmitted on the central conduit 108.

With reference to FIGS. 5A to 5F, the wiring diagram of each of the isolation mechanism 106 wired in series is shown. Provided an electric power is supplied to each of the relay (or coil) 502, the circuit between the solar panel serviced by the isolation mechanism continues to allow electricity generated by each of the solar panel to continue to be transmitted to the central conduit arranged to receive electricity from each of the panels in the array. A warning LED 204, which may be red or any other suitable colour, is also powered by the electrical power generated by each panel to alert a user that electricity is transmitted to the central conduit. As each of the isolation mechanisms is connected in series, the remaining second, third, fourth, fifth and sixth isolation mechanism 106 continue to transmit electrical current which is subsequently transmitted to the central conduit.

When a user wishes to isolate the portions of the solar panel array for access, service or emergency situations, the user can disconnect the DC power supply in the switchboard. Upon disconnection of the power supply, each of the relays in each of the isolation mechanisms 106 will return to their natural state of an open circuit between the serviced solar panel and the central conduit. In so doing, the isolation mechanism 106 isolates each of the solar panels and thereby reduces the risk of large voltage or current flows which may produce a hazardous environment. For example, where each solar panel is arranged to generate 100 watts of electrical power, the combined array may generate 600 watts of power, which may present a dangerous hazard.

As shown in FIGS. 5A to 5F, once the isolation mechanism isolates each solar panel, the electricity generated by each solar panel is rerouted to power an alert LED 202, such as a green LED although any suitable colour is possible. Additional power may also be redirected to alternative circuits, to ground or to an open circuit such that the solar panel no longer poses as a potential electrical hazard.

In alternative embodiments, the isolation mechanisms may be wired in parallel. In these embodiments, the output voltage of the DC power supply unit may be at a maximum of the voltage requirement of each isolation mechanism. Preferably, the isolation mechanisms are wired in series as a series circuit is advantageous in that should a single isolation mechanism fail and thereby isolate each solar panel, then all of the isolation mechanism will also be isolated each other solar panel.

With reference to FIGS. 6A to 6E, there is shown a wiring diagram of an alternative embodiment of a system 600 for isolating portions of a power supply array. In this embodiment, the system 600 has a single housing 602 arranged to house a plurality of isolation mechanisms 604 each arranged to isolate at least one portion of a power supply array, such as a solar panel array comprising a plurality of solar panels. In some examples, each of the isolation mechanism 604 may include one or more actuators, such as a switch or relay which are arranged to isolate portions of a power supply array from a central conduit such that electrical power generated by each portion of the power supply array is directed away from the central conduit to prevent the electrical power from being combined into the central conduit 108.

In one example, the isolation mechanisms 604 may include electric actuators 605 such as electrically operated switches or relays arranged to open or close based on the whether electricity is transmitted to the switch. Preferably, the switch is arranged to allow the transmission of electricity generated by each portion to the central conduit when electricity is transmitted to the switch from a controllable power source, such as a power supply 110. Once electricity from the power supply 110 is disconnected from the switch, the switch will open to an alternative position which will direct electricity generated by each portion of the power supply array away from the central conduit 108 and thereby isolating the portion of the power supply array which is served by the switch.

Figure 6A:
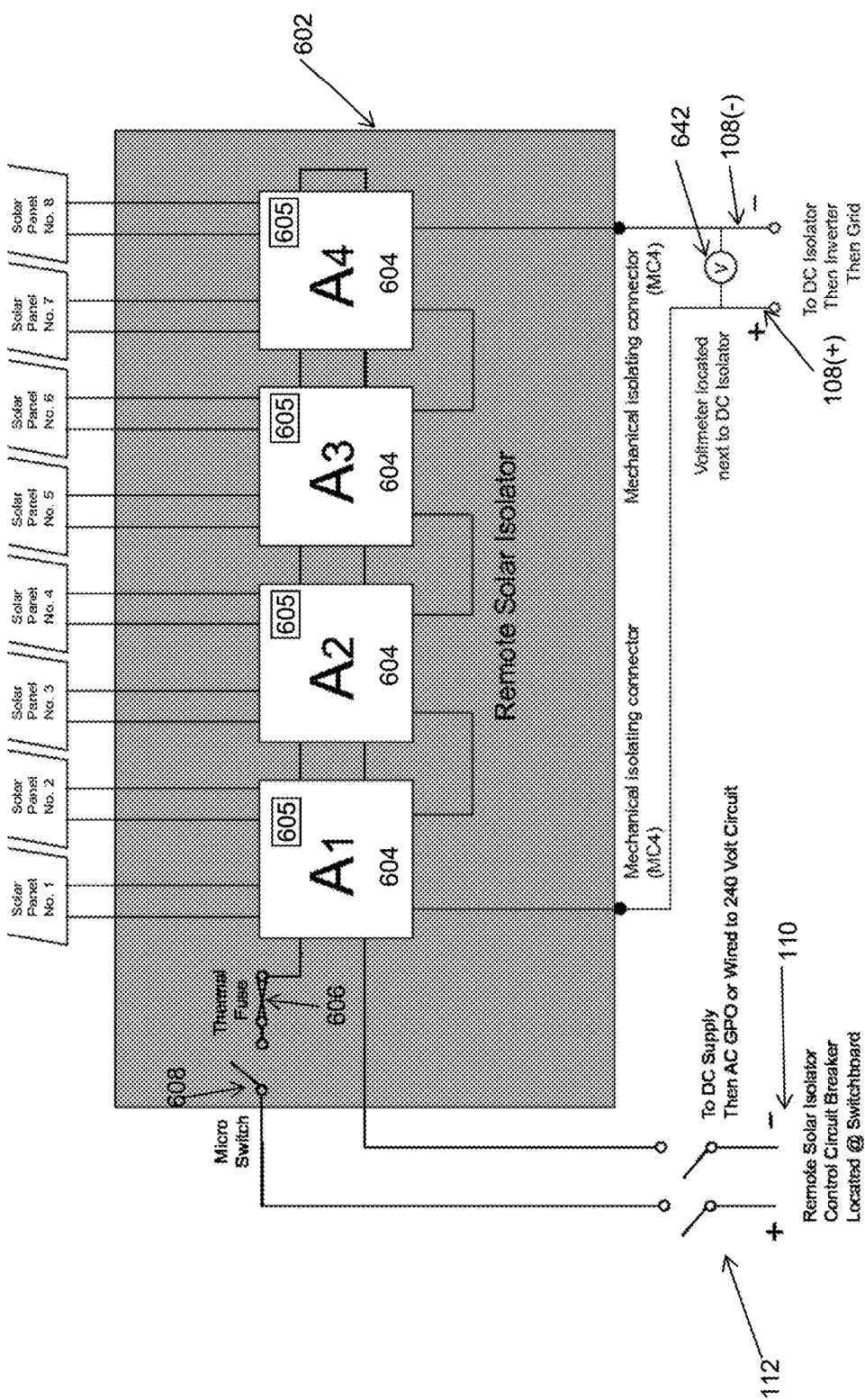
Figure 6B:
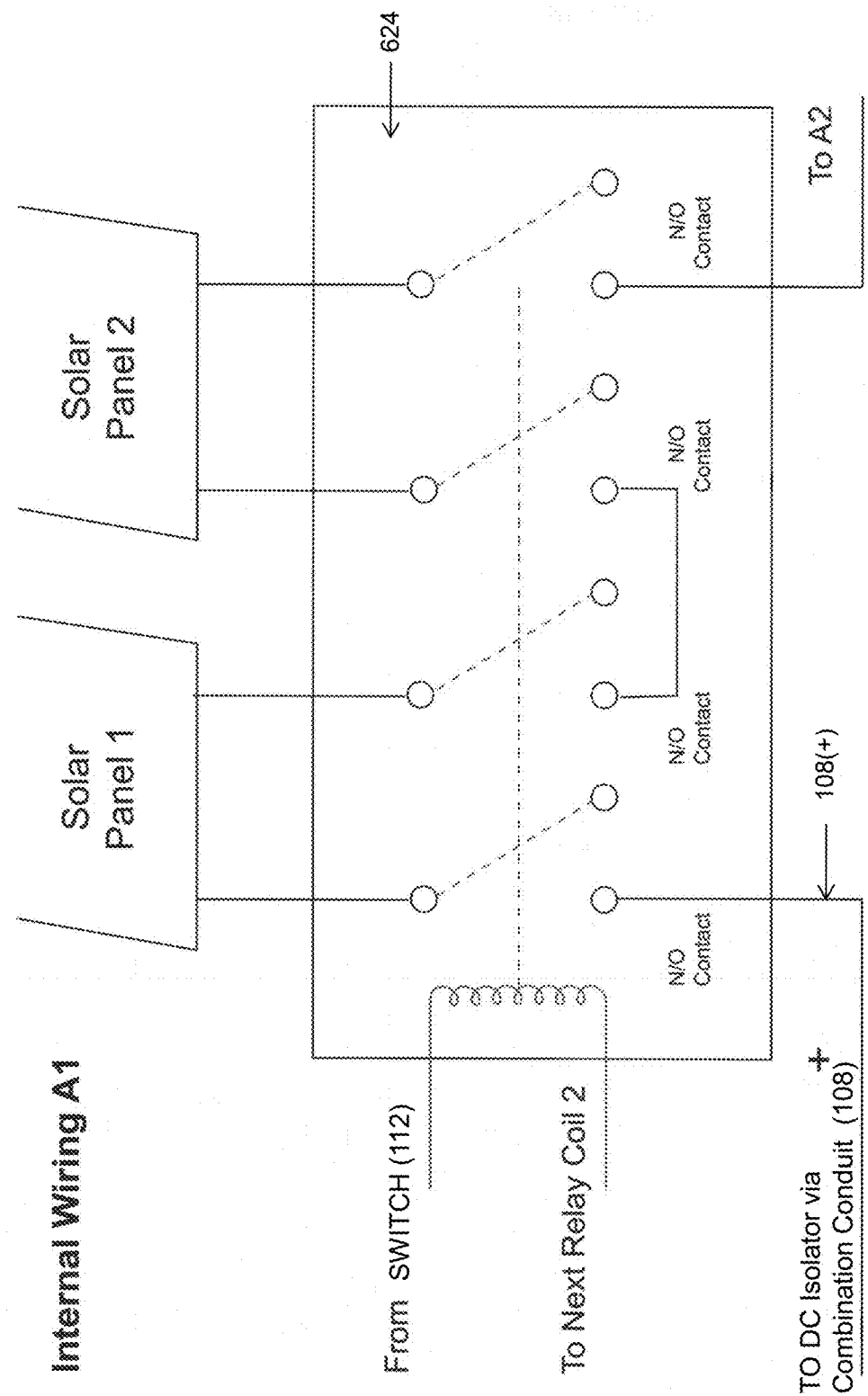
Figure 6D:
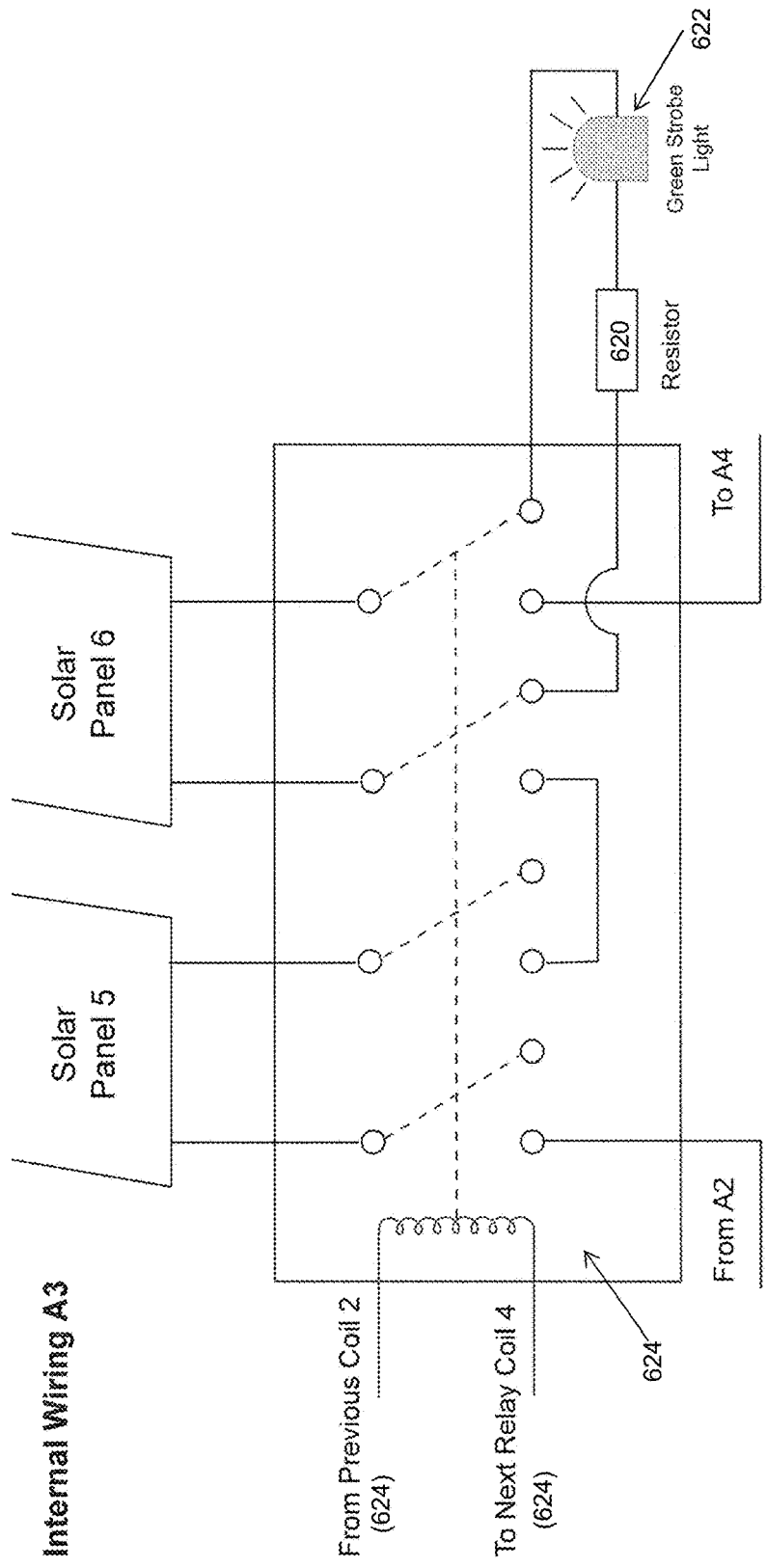

In some embodiments, such as the embodiment shown in FIGS. 6A to 6E, each of the switches may be arranged to service more than one portions of the supply array. In these embodiments, the switch may be a 2 or 4 pole relay 624 arranged to service two or four electrical connectors of a portion of the power array such that the electrical connectors of each portion of the power array (such as a solar panel) can be connected or disconnected from a circuit. The circuit, may direct the electrical power from the portion of the power array to a central conduit 108, or, as shown in FIG. 6D, redirect the electrical power generated from a portion of the power array to an alert circuit comprising of a resistor 620, a diode (e.g. a zener diode) and a strobe light 622.

These relays 624 may be connected together in series, although a parallel connection is possible, to operate together such that when electricity from the power supply 110 is supplied to each of the relays 624, the relays 624 may continue to direct electrical power generated by each portion of the power array to a central conduit 108. However, when power from the power supply 110 is removed from the relays 624, the switches will open and direct the power generated by each portion away from the central conduit to an open circuit, secondary circuit or to ground.

These embodiments are advantageous in that the plurality of isolation mechanisms 604 can be installed into a single housing, thus reducing the cost of installation whilst providing a central point for servicing the isolation mechanisms 604.

In another embodiment, the isolation mechanisms are connected to the power supply 110 via a thermal circuit breaker 606 connected in series between the isolation mechanisms and the power supply 110. The thermal circuit breaker 606 is arranged to disconnect the isolation mechanisms from the power supply 110 when the breaker 606 reaches a certain temperature. In this embodiment, the thermal circuit breaker 606 may be a thermal fuse which is arranged to burn out, melt away or otherwise break the circuit once the thermal fuse reaches a predetermined temperature. In some other examples, the thermal circuit breaker 606 may be an electronically controlled switch which includes a thermostat arranged to break the circuit when the thermostat detects a certain predetermined temperature. These embodiments are advantageous in that in the event of excessive high temperatures, such as fire or extreme environmental conditions, the power array can be automatically isolated to reduce the risk of creating an electrical hazard for rescue groups or further damage to the power supply array.

In another embodiment, the isolation mechanism 604 may also include a micro switch 608 arranged to disconnect the power supply 110 from the isolation mechanism 604 when user manipulation of the isolation mechanism 604 or housing is detected. Preferably, this micro switch may be connected to an access panel of the housing and/or the main electrical switch board such than when access to the mechanism is required for maintenance or repairs, power from the power supply 110 is automatically disconnected and thus causing the isolation mechanism 604 to direct the electricity generated by each corresponding portions of the power supply array to an alternative circuit, and thus isolating the portions of the power supply array. This is advantageous in that the risk of electrocutions is reduced for electricians or other users accessing the housing to service the system 600.

In some embodiments, as shown in FIG. 6A, a voltmeter 642 may be connected to the central conduit 108 to measure to combine voltage generated by the power supply array. This volt meter is particularly useful as it can indicate in real time the voltage of the enter power supply array and thereby alerting a user as to the power transmitted on the central conduit 108. The voltmeter 642 may also be connected to an electronic processor or alert switch to record or alert a user of the voltage of the central conduit 108.

Figure 7A:
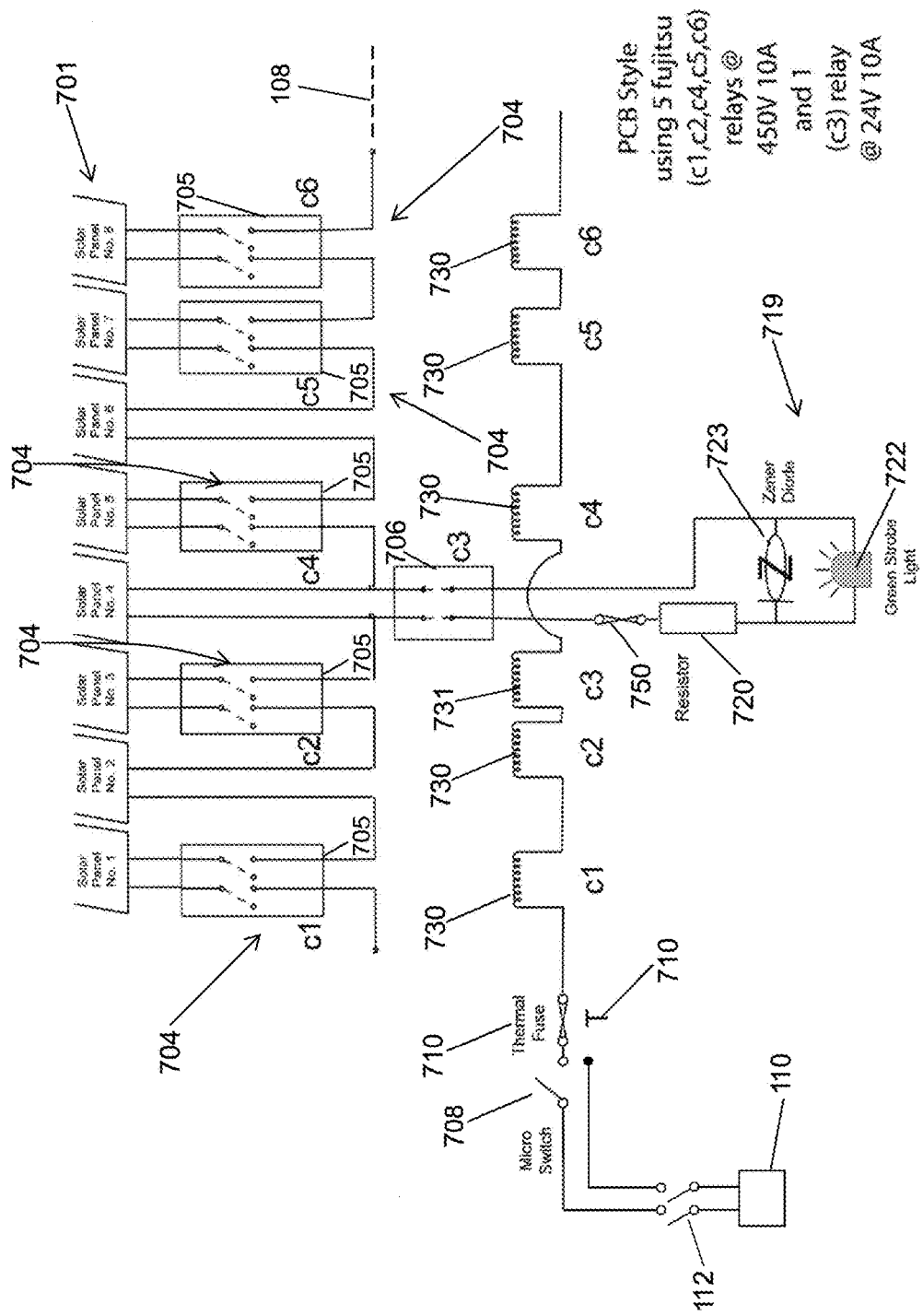
FIGS. 7A and 7B are wiring diagrams of a system for isolating a power supply array in accordance with another embodiment of the invention.
Figure 7B:
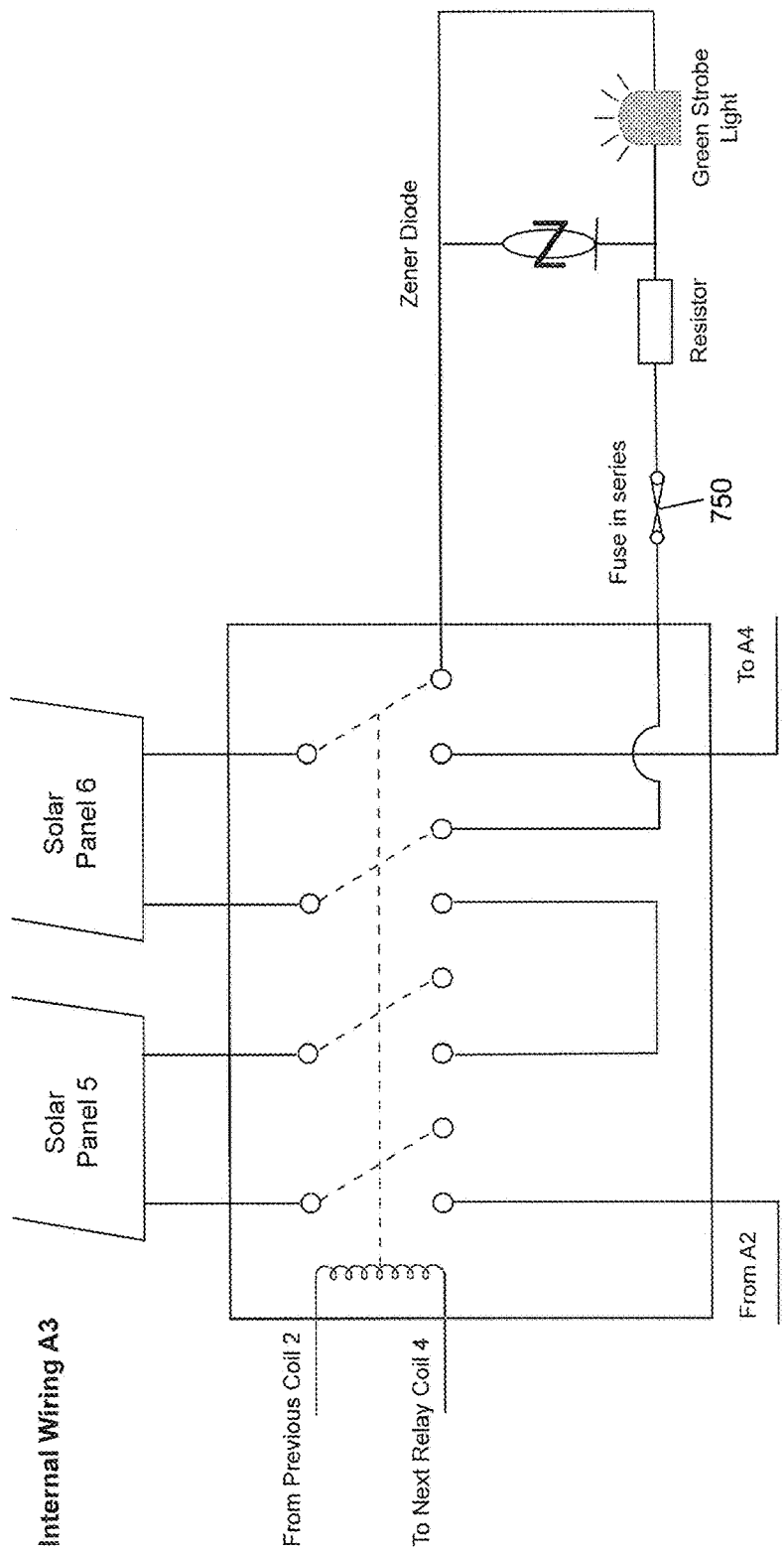

With reference to FIGS. 7A and 7B, there is shown a wiring diagram of a further embodiment of a system 700 for isolating portions of a power supply array 701. In this embodiment the system 700 is implemented as a PCB (Printed Circuit Board). The various components and features shown in the wiring diagram are disposed on a substrate. The substrate may be any suitable material that can be etched or can receive and retain conductive tracks. In one example the substrate may be a non-conductive material such as glass. In other examples the substrate may be formed from a semi conductive material such as silicon.

In this embodiment, the system 700 comprises a plurality of isolation mechanisms 704, each arranged to isolate at least a portion of a power supply array 701. In one example the power array 701 is a solar panel array, as illustrated in FIG. 7A.

In some examples, each of the isolation mechanism 704 may include one or more actuators, such as a switch or relay which are arranged to isolate portions of a power supply array from a central electrical conduit such that electrical power generated by each portion of the power supply array 701 is directed away from the central conduit to prevent the electrical power from being combined across a central conduit 108. The system 700 may be used with the similar power supply shown in FIG. 6A.

In one example, the isolation mechanisms 604 may include electric actuators such as electrically operated switches or relays arranged to open and close based on whether electricity is transmitted to the switch. The switch is arranged to allow transmission of electricity generated at each portion of the array 701 to a central conduit, such as conduit 108. In this embodiment the PCB circuit shown in FIG. 7A is connected to a central conduit 108 and a power supply 110. Once electricity from the power supply 110 is disconnected to the switch, the switch will open to an alternative position which will direct electricity generated by each portion of the power supply array away from the central conduit and therefore isolating at least a portion of the power supply array which is served by the switch.

The system 700 may be a relay as its isolation mechanism 704. In one example the relay 705 may be a Fujitsu FTR-J2 series ultra high voltage DC relay. In other examples any other high voltage DC or high voltage AC relay may be used. In one example the relays 705 may be 450V 10 A rated relays.

In the illustrated embodiment each of the switches may be arranged to service one or more portions of the supply array. In these embodiments the switch may be a 2 or 4 pole relay. In the illustrated embodiment of FIG. 7A, 2-pole relays are used. In the illustrated embodiment shown in FIG. 7B, a 4 pole relay may be used as part of the isolation mechanism 704. In a further embodiment any combination of 2 and 4 pole arrays can be used.

In these embodiments the 2 or 4 pole relays are arranged to service two or four electrical connectors of a portion of the power array such that the electrical connectors of each portion of the power array (such as a solar panel) can be connected or disconnected from a circuit. The circuit may direct electrical power to either a central conduit 108, or redirect the electrical power generated from a portion of the power array to an alert circuit 719 comprising a resistor 720, strobe light 722 and a voltage or shunt regulator 723. The shunt regulator is used to regulate voltage across the alert circuit, in particular across the resistor 720 and strobe light 722. In one example the shunt regulator is a zener diode 723 used to regulate voltage across at least the strobe light 722. The zener diode 723 is advantageous because it regulates voltage across small circuits because the zener diode has low impedance in one direction.

The isolation mechanisms 704, in particular the relays, comprise one or more relay coils 730. In one example each relay 705 comprises at least one relay coil that operates or controls the relay. The relay coils control the relays to connect and disconnect the power array and control whether power is directed to the central conduit 108 or if at least some of the power is directed to the alert circuit.

As explained earlier the relays 705 may be connected in series, although a parallel connection of relays is also contemplated.

The relays 705, whether in series or parallel connection, are arranged to operate together such that electricity from the power supply 110 is supplied to each of the relays, the relays 705 may continue to direct electrical power generated at each portion away from the central conduit to an open circuit, secondary circuit or to ground.

The embodiments described are advantageous because the isolation mechanisms 704 can be disposed on a single PCB which reduces the cost of installation and fabricating the circuit. The PCB also makes the isolation circuit easy to transport and easy to install. The PCB implementation of the system also allows for a central point for servicing the isolation mechanisms. The system 700 is further advantageous because it isolates each section of the power supply array such that when the power to the isolation mechanisms 704 is switched off the voltage from the various sections of the power supply array is either cut off or is localised and does not add up across the isolation mechanisms. This allows for a maintenance person to safely maintain the power supply away or any other part.

In one embodiment the system 700 further comprises an additional relay 706 that connects between the alert circuit 719 and a portion of the power supply array. The relay 706 functions as a re-directing relay. The relay 706 re-directs a portion of the power from the power supply array to the alert circuit 719 to operate the strobe light. The relay 706 is arranged to re-direct some power to the alert circuit 719 when there is no power supplied to relay coils 730 and 731. In this example coil 731 is arranged to interact or be part of the relay 706 and control the relay 706. When power is supplied to the coil 731, the coil controls the relay 706 to isolate the alert circuit, hence not illuminating the green strobe. Conversely when power is not supplied to the coil 731, the coil 731 is arranged to control the relay 731 such that power from at least a part of the power supply array 701 is supplied to the alert circuit 719 to power the strobe light 722.

The relay 706 and alert circuit are advantageous because the strobe light 722 indicates when the power supply array has been isolated and when it is safe for a person to do maintenance work around the power supply array. The relay 706 and alert circuit arrangement 719 is advantageous because it acts as an indicator to other people.

In a further embodiment, the isolation mechanisms are connected to the power supply 110 via a thermal circuit breaker 710 connected in series between the isolation mechanisms and power supply 110. The thermal circuit breaker 710 is arranged to disconnect the isolation mechanisms from the power supply 110 when the breaker 710 reaches a particular temperature. In one embodiment the thermal circuit breaker 710 may be a thermal fuse which is arranged to burn out, melt away or otherwise break the circuit once the thermal fuse reaches a predetermined temperature. The circuit breaker 710 is also disposed on the same PCB as the isolation mechanisms. In other embodiments, the first circuit breaker (i.e. the thermal circuit breaker) 710 may be an electronically controlled switch which includes a thermostat arranged to break the circuit when the thermostat detects a certain pre-determined temperature. These embodiments are advantageous because in an event of excessive temperature, such as fire or extreme environmental conditions, the power array can be automatically isolated to reduce work of electrical hazard.

The thermal circuit breaker breaking the circuit also can cause the relay 706 to supply power to the strobe 722 to indicate a safe electrical condition.

In another embodiment the alert circuit 719 also comprises a second circuit breaker 750. The second circuit breaker may be a fuse, a thermal fuse, thermostat, an electronically controlled fuse or an electronically controlled thermal fuse or any other suitable circuit breaker. The second circuit breaker is arranged to break the circuit to the alert circuit 719 if either the voltage or current exceeds the thresholds of the second circuit breaker 750. In another embodiment the second circuit breaker 750 breaks the circuit to the alert circuit 719 if the temperature at the alert circuit or at the second circuit breaker 750 exceeds a threshold temperature. These embodiments are advantageous in the event of excess current, voltage or temperature the alert circuit 719 is isolated to protect the alert circuit 719.

In another embodiment, the isolation system 700 may further comprise a micro switch 708 arranged to disconnect the power supply 110 from the isolation mechanism 704. The micro switch may be electronically controlled or manually operated. Preferably the micro switch 708 is arranged for manual manipulation by a user. Preferably the micro switch 708 directs power from the power supply 110 to an alternative circuit or ground when the micro switch 708 is open. The micro switch can be opened by a user who wishes to isolate the power supply array. When the user activates the micro switch 708 (i.e. opens the micro switch) some of the power is directed to the alert circuit 719 to indicate a safe condition, by lighting the strobe.

Opening the micro switch 708 causes the isolation mechanisms 704 to direct electricity generated by the corresponding portions of the power supply array 701 to an alternative circuit or ground, thus isolating the portions of the power supply array 701. This is advantageous in that the risk of electrocutions is reduced for electricians or other users accessing the power supply array at the system 700 or the housing (as mentioned earlier). The isolation system 700 is advantageous because it allows a user to isolate various parts of a power supply array to prevent electrocutions. The system is also advantageous because it can indicate to a user when the power supply array portions have been isolated.

In a further embodiment, the system for isolating portions of a power supply array can comprise a photoelectric cell. The photoelectric cell is arranged to turn the system off if there is low light which would save power at night. Having a photoelectric cell in series with the relay allows the system to automatically go off and the green light would not flash as the panel would not produce sufficient energy at night. This photoelectric cell would be normally closed and open under no light conditions. The addition of a photoelectric cell is advantageous because it provides power saving at night.

In a further embodiment, the present system may comprise a movement sensor. The movement sensor is arranged to interact with the switching circuit and control power to the coils 730. This movement sensor is arranged to send a signal to the coils and isolation system 700 to activate the relays and isolate the power array (i.e. solar panels). This would be advantageous because isolation of the power array is automated when a person access the roof where the solar array is installed. The movement sensor provides automatic activation of the system. This movement sensor can be wired in series with the relays and would normally be in the closed position opening only when movement is detected. This movement sensor is advantageous because it can be used where a power array is installed in areas that can be accessed by children or where access may be obtained without isolation. The movement sensor allows automatic isolation of the power supply array or a portion of the power supply array in response to movement making the systems a safer system to use.

A further advantage of the present system is that when the dc control comes from the incoming grid via a power supply numerous solar arrays on numerous homes may be simultaneously disconnected by isolating the area grid supply. This would be advantageous in times of flood or fire ensuring that all lethal voltages within an area or suburb have been safely isolated.

In another embodiment, the system may comprise a user display. The user display may be an analogue or digital display. The display can display any number of parameters. In one example, the display may be arranged to display the voltage at the power array or voltages at various positions of the power array. In another embodiment, the display may be arranged to display the power out pout from the power supply array or the power output at the central conduit 108. This is advantageous because a person monitoring the power supply array or a maintenance person can easily see what the parameters or outputs of the power supply array are.

Figure 8A:
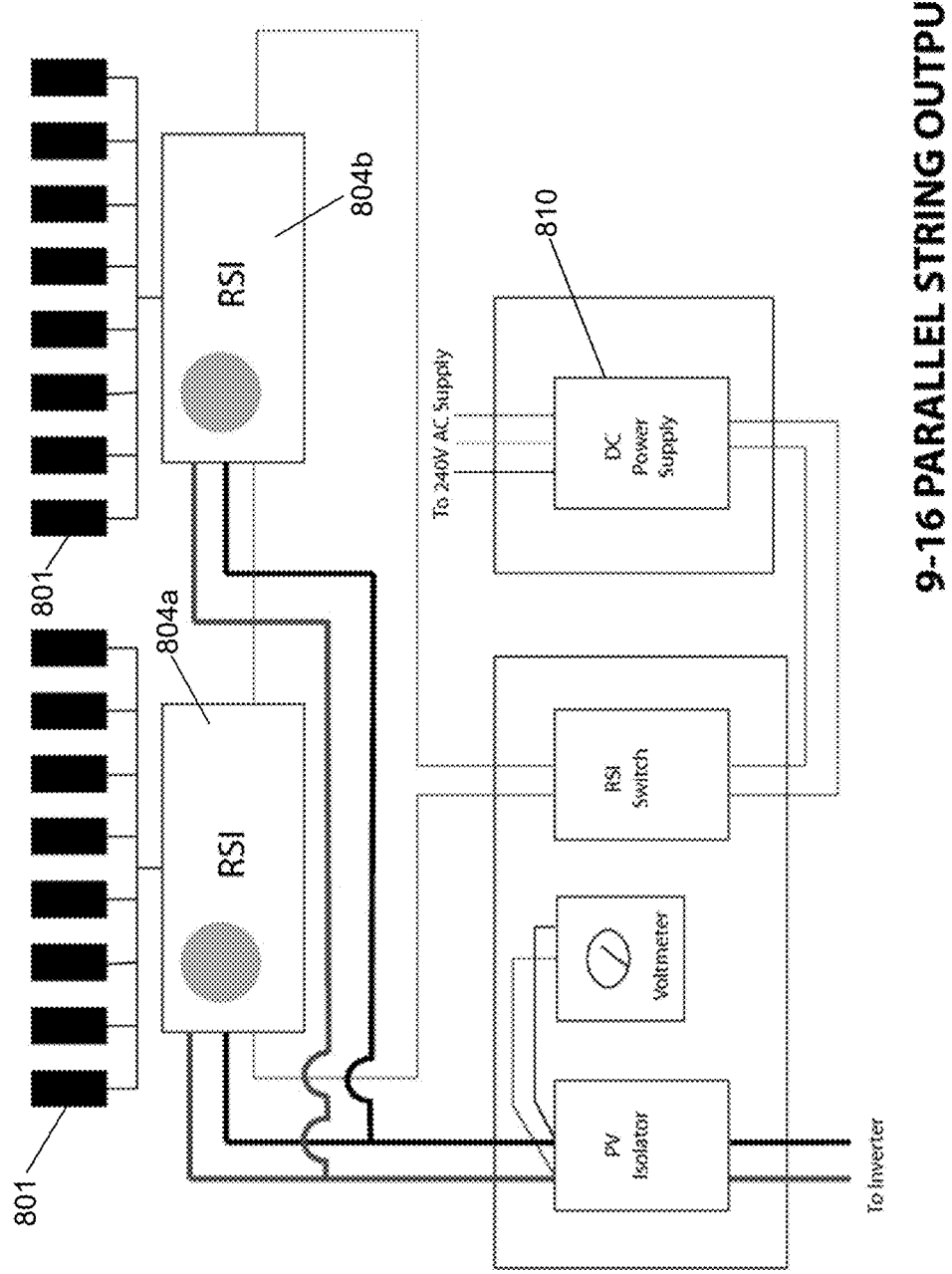
FIGS. 8A and 8B are wiring diagrams of a system for isolating a power supply array in addition to the power supply system.
Figure 8B:
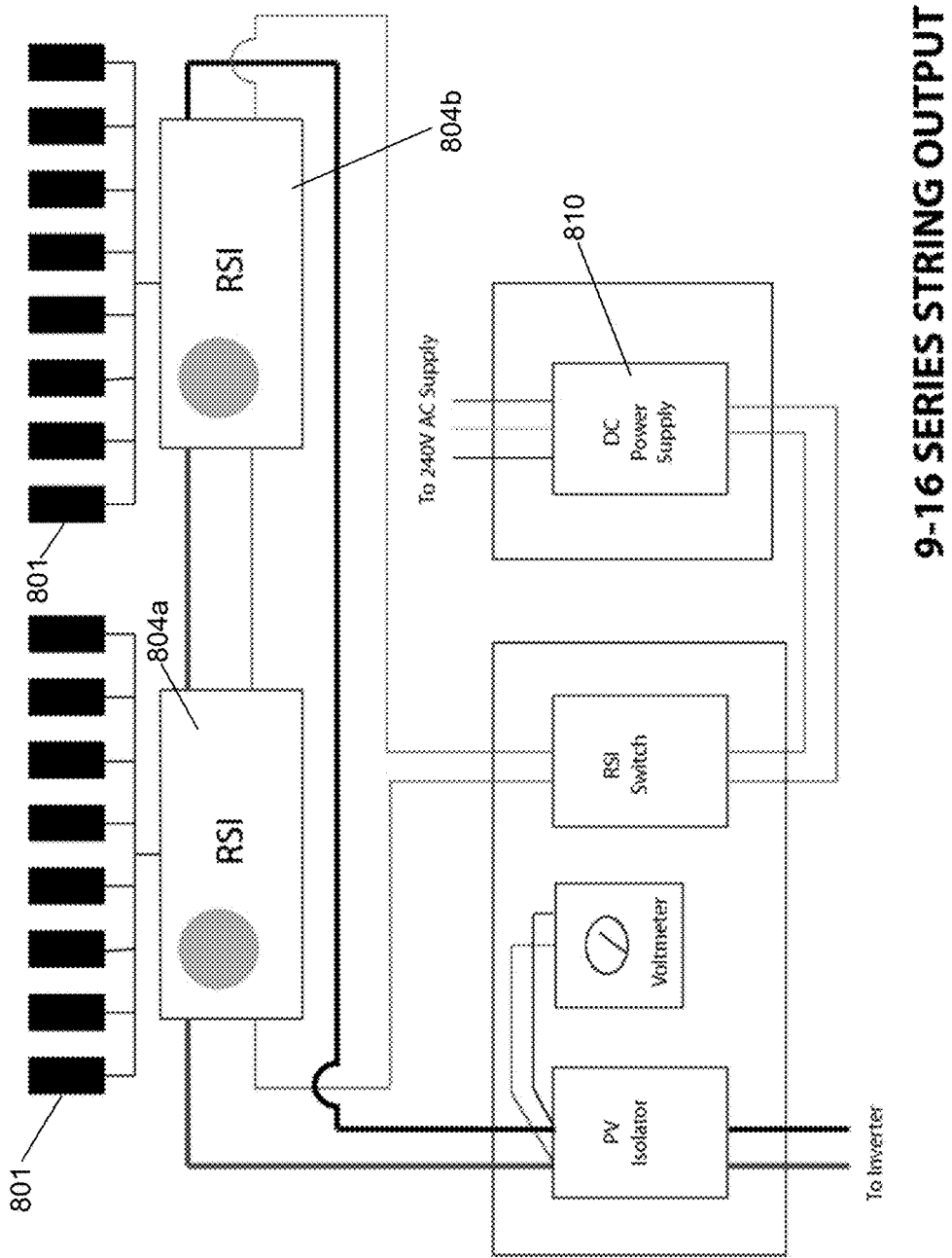

With reference to FIGS. 8A and 8B there are shown two forms of the system for isolating portions of a power supply array and the associated power supply system arranged to supply power to the system for isolating portions of a power supply array. FIGS. 8A and 8B show two arrays of isolation mechanisms 804a, 804b and two arrangements for wiring the arrays of isolation mechanisms. Each array of isolation mechanism 804a or 804b may comprise one or more isolation mechanism. The isolation mechanisms have been described earlier, for example features 604 or 704 and so on. In one form the arrays of isolation mechanisms 804a, 804b may be wired in series with each other. This arrangement is advantageous since the isolation mechanism arrays 804a, 804b can be wired to a greater number of solar panels (i.e. power supply arrays). The series arrangement allows for greater voltage to be supplied to the inverter. This arrangement is shown in FIG. 8B. FIG. 8A shows a further arrangement of the arrays of the isolation mechanism. FIG. 8A shows the array of isolation mechanisms 804a, 804b are wired parallel to each other. This arrangement allows for greater current to be supplied to the inverter. Any suitable arrangement of the array of isolation mechanisms can be used. The arrangement used is dependent on the voltage/current requirements and the requirements of the inverter.

The isolation mechanism arrays 804a, 804b, and the isolation mechanisms are controlled by a power supply 810. The power supply 810 or other power supplied described e.g. 110 can be either a DC power supply or an AC power supply. In the illustrated example of FIGS. 8A and 8B the power supply is shown as a DC power supply. Any type of current can be used depending on where the system for isolating a power supply array 801 is installed. The voltage rating of the power supply can vary to any suitable voltage depending on the location where the system is installed. In one example the power supply 810 may be a 240V supply, but in other forms the power supply 810 may be 110V or 250V and so on. The power supply 810 receives power from a part of the power supply array 801. The power supply 810 is arranged to control the activation of the isolation mechanisms. The power supply 810 may be arranged to receive power or direct power from part of the power supply array. In one example the power supply 810 is arranged to receive and direct power from the solar panels. This is advantageous because if power supply array 801 (e.g. the solar panels), is switched off, or if there is fault in the power supply array then the power supply is switched off and the isolation mechanism are triggered to isolate the solar panels. This ensures that the roof or the power supply array is isolated such that there is no back feed of current or power to the solar panels. This ensures the safety of the power supply array (i.e. the solar panels).

It will be appreciated by persons skilled in the art that numerous variations and/or modifications may be made to the invention as shown in the specific embodiments without departing from the spirit or scope of the invention as broadly described. The present embodiments are, therefore, to be considered in all respects as illustrative and not restrictive.

Any reference to prior art contained herein is not to be taken as an admission that the information is common general knowledge, unless otherwise indicated.

The invention claimed is:

1. A system for isolating portions of a power supply array comprising:
a plurality of isolation mechanisms, each being in electrical communication with a terminal of a respective portion of the power supply array; and
each isolation mechanism comprising an electric actuator powered by a power source, each isolation mechanism being arranged to disconnect the respective portion of the power supply array from another portion of the power supply array when the isolation mechanism is actuated,
wherein each said portion of the power supply array comprises at least one solar panel,
wherein a switch is connected in series between the electric actuators and the power source, the switch being operable to disconnect the power source from the electric actuators thereby actuating the isolation mechanisms, and
wherein the power source is separate to the power supply array.

2. A system in accordance with claim 1, wherein the terminal includes at least one of an output terminal and an input terminal.

3. A system in accordance with claim 1, wherein the switch is a thermal circuit breaker arranged to be actuated at a predetermined temperature.

4. A system in accordance with claim 1, further comprising a conduit in electrical communication with the power supply array and arranged to combine and transmit electricity supplied by each portion of the power supply array.

5. An electrical system comprising a power supply array and the system for isolating the power supply array in accordance with claim 1.

6. A solar panel array comprising the system for isolating portions of a power supply array in accordance with claim 1.

7. A system in accordance with claim 1, wherein the electric actuators are arranged in series.

8. A system in accordance with claim 1, wherein the isolation mechanisms further comprise relay switches and the electric actuators comprise relay coils.

9. A system in accordance with claim 1, wherein the power source is a DC power supply powered by an electricity grid.

10. A system in accordance with claim 9, wherein the power source is controllable remotely to disconnect power from the electric actuators.

11. A system in accordance with claim 1, wherein when the isolation mechanisms are activated, each said portion of the power supply array forms an open circuit.

12. A system in accordance with claim 1, wherein the isolation mechanisms are located in a housing.

13. A system in accordance with claim 12, further including a micro switch arranged to disconnect the electric actuators from the power source when the housing is manipulated.

14. A system in accordance with claim 1, wherein when the isolation mechanisms are actuated, all of the solar panels are disconnected from each other.

15. A system in accordance with claim 1, wherein at least one of the isolation mechanisms is connected to a plurality of solar panels, and wherein each of the plurality of solar panels is disconnected from a remainder of the plurality of solar panels when the at least one of the isolation mechanisms is actuated.

16. A system for isolating portions of a power supply array comprising:
a plurality of electrically-powered isolators, each being in electrical communication with a respective portion of the power supply array, wherein each said portion of the power supply array comprises at least one solar panel;
a common power source that powers each isolator, the common power source being separate to the power supply array,
each isolator comprising a device and being arranged to disconnect the respective portion of the power supply array from another portion of the power supply array when the isolator is actuated; and a switch connected in series between the electric actuators and the common power source, the switch being operable to simultaneously disconnect the power source from the isolators to actuate the isolators.

* * * * *